(12) United States Patent
Tamiya et al.

(10) Patent No.: US 10,714,171 B2
(45) Date of Patent: Jul. 14, 2020

(54) NAND FLASH MEMORY SYSTEM STORING MULTI-BIT DATA AND READ/WRITE CONTROL METHOD THEREOF

(71) Applicant: Toshiba Memory Corporation, Minato-ku, Tokyo (JP)

(72) Inventors: Manabu Tamiya, Kanagawa (JP); Yasuyuki Ushijima, Kanagawa (JP); Akihisa Ohta, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/915,597

(22) Filed: Mar. 8, 2018

(65) Prior Publication Data

US 2019/0066776 A1 Feb. 28, 2019

(30) Foreign Application Priority Data

Aug. 28, 2017 (JP) ................................ 2017-163352

(51) Int. Cl.

| G11C 11/56 | (2006.01) |
|---|---|
| H01L 27/11556 | (2017.01) |
| G11C 16/14 | (2006.01) |
| G11C 16/04 | (2006.01) |
| G11C 16/26 | (2006.01) |
| G11C 16/10 | (2006.01) |
| H01L 27/11582 | (2017.01) |

(52) U.S. Cl.
CPC ...... *G11C 11/5642* (2013.01); *G11C 11/5628* (2013.01); *G11C 11/5635* (2013.01); *H01L 27/11556* (2013.01); *G11C 16/0408* (2013.01); *G11C 16/0483* (2013.01); *G11C 16/10* (2013.01); *G11C 16/14* (2013.01); *G11C 16/26* (2013.01); *H01L 27/11582* (2013.01)

(58) Field of Classification Search
None
See application file for complete search history.

(56) References Cited

U.S. PATENT DOCUMENTS

| 5,272,669 A * | 12/1993 | Samachisa | ........... G11C 11/5621 365/185.03 |
|---|---|---|---|
| 5,440,505 A * | 8/1995 | Fazio | ................... G11C 11/5621 365/185.03 |

(Continued)

FOREIGN PATENT DOCUMENTS

| JP | 2008-117471 A | 5/2008 |
|---|---|---|
| JP | 2009-059453 A | 3/2009 |

(Continued)

*Primary Examiner* — J. H. Hur
(74) *Attorney, Agent, or Firm* — White & Case LLP

(57) ABSTRACT

According to one embodiment, a memory system comprising: a semiconductor storage device including a memory cell connected to a word line and capable of storing n-bit data (n is an integer of 2 or more); and a controller circuit, wherein the semiconductor storage device determines a value of the n-bit read data stored in the memory cell, by a first reading operation using k reading voltages different from each other (k is an integer equal to or higher than $2^{(n-1)}$ and less than $2^n-1$), and the controller circuit converts the value of the n-bit read data into data corresponding to (k+1) decimal data.

20 Claims, 15 Drawing Sheets

(56) References Cited

U.S. PATENT DOCUMENTS

| | | | | |
|---|---|---|---|---|
| 5,521,865 A * | 5/1996 | Ohuchi | ............... | G11C 11/5621 365/185.03 |
| 5,570,315 A * | 10/1996 | Tanaka | ................ | G11C 11/5621 365/185.03 |
| 5,844,841 A * | 12/1998 | Takeuchi | ............ | G06F 11/1072 365/185.03 |
| 7,558,108 B2 * | 7/2009 | Eshel | ................. | G11C 11/5671 365/185.03 |
| 7,782,665 B2 * | 8/2010 | Turbanti | ............ | G11C 16/3436 365/168 |
| 7,889,545 B2 * | 2/2011 | Lee | ..................... | G11C 11/5678 365/163 |
| 8,711,617 B2 * | 4/2014 | Shen | ................... | G11C 11/5621 365/185.03 |
| 2004/0080979 A1 * | 4/2004 | Park | .................... | G11C 11/5628 365/185.03 |
| 2008/0106946 A1 | 5/2008 | Inoue et al. | | |
| 2009/0109745 A1 * | 4/2009 | Aritome | ............. | G11C 11/5628 365/185.03 |
| 2009/0109746 A1 * | 4/2009 | Aritome | ............. | G11C 11/5628 365/185.03 |
| 2009/0267128 A1 | 10/2009 | Maejima | | |
| 2009/0268522 A1 | 10/2009 | Maejima | | |
| 2010/0110788 A1 * | 5/2010 | Bauer | .................... | G11C 11/56 365/185.03 |
| 2010/0207195 A1 | 8/2010 | Fukuzumi et al. | | |
| 2010/0226164 A1 | 9/2010 | Nagashima et al. | | |
| 2010/0238701 A1 | 9/2010 | Tsukamoto et al. | | |
| 2011/0205805 A1 | 8/2011 | Honma et al. | | |
| 2011/0284946 A1 | 11/2011 | Kiyotoshi | | |
| 2013/0275714 A1 * | 10/2013 | Parthasarathy | ......... | G06F 12/06 711/202 |

FOREIGN PATENT DOCUMENTS

| | | |
|---|---|---|
| JP | 2009-099199 A | 5/2009 |
| JP | 2009-193626 A | 8/2009 |
| JP | 2009-277348 A | 11/2009 |
| JP | 4398962 B2 | 1/2010 |
| JP | 2010-225221 A | 10/2010 |
| JP | 2011-118984 A | 6/2011 |

* cited by examiner

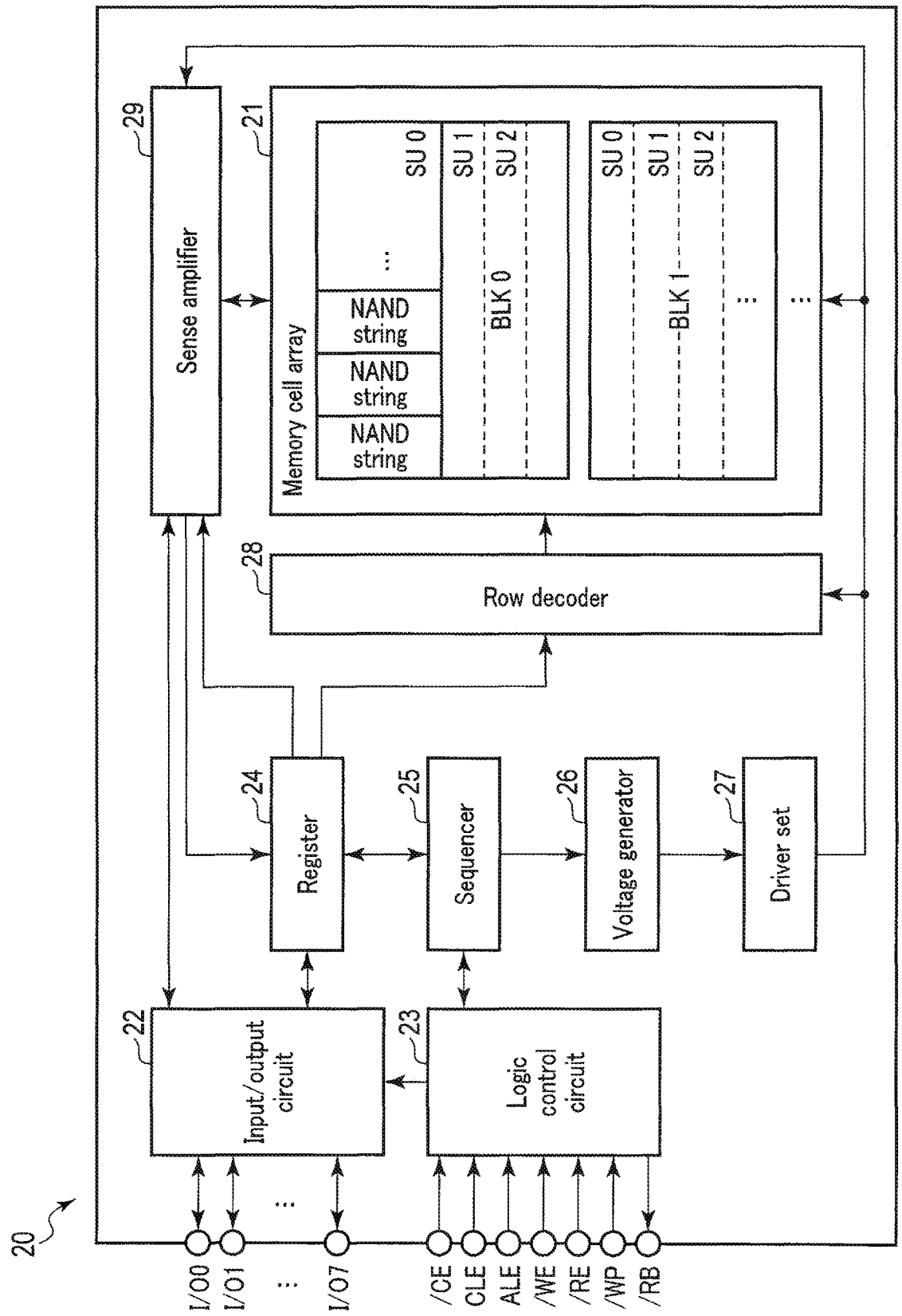
F I G. 2

NAND FLASH MEMORY SYSTEM STORING MULTI-BIT DATA AND READ/WRITE CONTROL METHOD THEREOF

CROSS-REFERENCE TO RELATED APPLICATIONS

This application is based upon and claims the benefit of priority from prior Japanese Patent Application No. 2017-163352, filed Aug. 28, 2017, the entire contents of which are incorporated herein by reference.

FIELD

Embodiments described herein relate generally to a memory system and control method of the memory system.

BACKGROUND

A memory system including a NAND flash memory serving as a semiconductor storage device, and a controller circuit controlling the NAND flash memory is known.

BRIEF DESCRIPTION OF THE DRAWINGS

FIG. 2 is a block diagram for explaining a configuration of a semiconductor storage device according to the first embodiment;

DETAILED DESCRIPTION

Figure 1:
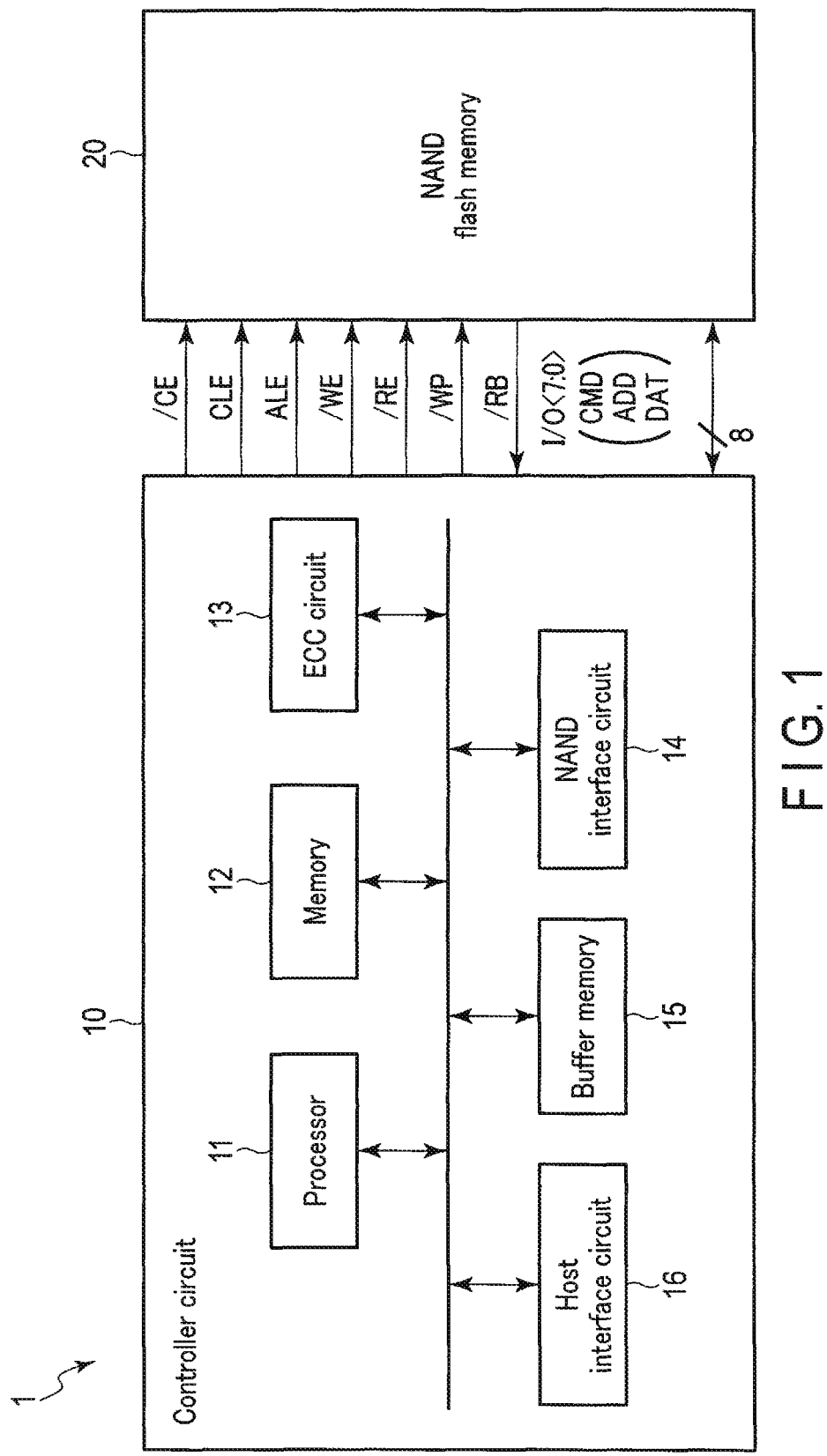
FIG. 1 is a block diagram for explaining a configuration of a memory system according to a first embodiment.

In general, according to one embodiment, a memory system includes: a semiconductor storage device including a memory cell connected to a word line and capable of storing n-bit data (n is an integer of 2 or more); and a controller circuit. The semiconductor storage device determines a value of the n-bit read data stored in the memory cell, by a first reading operation using k reading voltages different from each other (k is an integer equal to or higher than $2^{(n-1)}$ and less than $2^n-1$). The controller circuit converts the value of the n-bit read data into data corresponding to (k+1) decimal data.

The following is explanation of embodiments with reference to drawings. Note that in the following description, common reference numerals denote components having the same functions and configurations.

A memory system according to a first embodiment includes, for example, a semiconductor storage device serving as a NAND flash memory, and a controller circuit controlling operations of the semiconductor storage device.

1.1 Configuration

The following is explanation of configuration of the memory system according to the first embodiment.

1.1.1 Whole Configuration of Memory System

The following is explanation of a configuration example of the memory system according to the first embodiment, with reference to FIG. 1. FIG. 1 is a block diagram illustrating an example of configuration of the memory system according to the first embodiment. A memory system 1 is, for example, a memory card or a solid state drive, and communicates with, for example, an external host apparatus (not illustrated). The memory system 1 retains data from the host apparatus, and reads data to the host apparatus.

As illustrated in FIG. 1, the memory system 1 includes a controller circuit 10 and a semiconductor storage device (NAND flash memory) 20. The controller circuit 10 receives a command from the host apparatus, and controls the semiconductor storage device 20, on the basis of the received command. Specifically, the controller circuit 10 writes data which is instructed to be written from the host apparatus, to the semiconductor storage device 20, and reads data which is instructed to be read from the host apparatus, from the semiconductor storage device 20 and transmits the data to the host apparatus. The controller circuit 10 is connected to the semiconductor storage device 20 through a NAND bus. The semiconductor storage device 20 includes a plurality of memory cells, and stores data in a nonvolatile manner.

The NAND bus performs transmission and reception of each of signals /CE, CLE, ALE, /WE, /RE, /WP, /RB, and I/O <7:0> in accordance with the NAND interface, through individual signal lines. The signal /CE is a signal to enable the semiconductor storage device 20. The signal CLE notifies the semiconductor storage device 20 that signal I/O <7:0> provided, while the signal CLE is of "H (High)" level, to the semiconductor storage device 20 is a command. The signal ALE notifies the semiconductor storage device 20 that signal I/O <7:0> provided, while the signal ALE is of "H" level, to the semiconductor storage device 20 is an address. The signal /WE instructs the semiconductor storage device 20 to take in signal I/O <7:0> provided, while the signal /WE is of "L (Low)" level, to the semiconductor storage device 20 as data to be written. The signal /RE instructs the semiconductor storage device 20 to output signal I/O <7:0> as data to be read. The signal /WP instructs the semiconductor storage device 20 to prevent data writing and data erase. The signal /RE indicates whether the semiconductor storage device 20 is in a ready state (a state of receiving a command from an outside), or a busy state (a state of receiving no command from the outside). The signal I/O <7:0> is, for example, an 8-bit signal. The signal I/O <7:0> is substance of information transmitted and received between the semiconductor storage device 20 and the controller circuit 10, and includes a command CMD, an address ADD, and data DAT. The data DAT includes write data and read data.

1.1.2 Configuration of Controller Circuit

The following is explanation of the controller circuit 10 of the memory system 1 according to the first embodiment, with reference to FIG. 1 continuously. The controller circuit 10 includes a processor (CPU: Central Processing Unit) 11, a memory (RAM: Random Access Memory) 12, an ECC (Error Check and Correction) circuit 13, a NAND interface circuit 14, a buffer memory 15, and a host interface circuit 16.

The processor 11 controls operations of the whole controller circuit 10. The processor 11 issues a read command based on the NAND interface to the semiconductor storage device 20, for example, in response to a data read command received from the host apparatus. The operation is also applicable to write operation and erase operation. The processor 11 has functions of executing various arithmetic operations on the read data from the semiconductor storage device 20.

The memory 12 is a semiconductor memory, such as a SRAM (Static RAM) and a DRAM (Dynamic RAM), and used as a work area of the processor 11. The memory 12 retains firmware to manage the semiconductor storage device 20, and various tables used in writing and reading of data to the semiconductor storage device 20. The details of data reading and writing using the tables will be described later. The memory 12 may be included in the controller circuit 10, or may be mounted on an external device (not illustrated) of the controller circuit 10.

The ECC circuit 13 performs error detection and error correction relating to the data stored in the semiconductor storage device 20. Specifically, in data writing, the ECC circuit 13 generates an error correction code, and adds the error correction code to write data. In data reading, the ECC circuit 13 decodes read data on the basis of the ECC code, and detects whether or not any error exists. When the error is detected, the ECC circuit 13 specifies bit position of the error, and corrects the error.

The NAND interface circuit 14 is connected with the semiconductor storage device 20 through the NAND bus, and manages communications with the semiconductor storage device 20. The NAND interface circuit 14 transmits a command CMD, an address ADD, and write data to the semiconductor storage device 20, in accordance with an instruction from the processor 11. The NAND interface circuit 14 also receives read data from the semiconductor storage device 20.

The buffer memory 15 temporarily stores data and the like received by the controller circuit 10 from the semiconductor storage device 20 and the host apparatus. The buffer memory 15 is also used as storage area to temporarily store read data from the semiconductor storage device 20, write data from the host apparatus, and data obtained by subjecting the data to the various arithmetic operations with the processor 11.

The host interface circuit 16 is connected with the host apparatus, and manages communications with the host apparatus. The host interface circuit 16 transfers, for example, commands and data received from the host apparatus to the processor 11 and the buffer memory 15, respectively.

1.1.3 Configuration of Semiconductor Storage Device

The following is explanation of a configuration example of the semiconductor storage device according to the first embodiment, with reference to FIG. 2. FIG. 2 is a block diagram illustrating an example of configuration of the semiconductor storage device according to the first embodiment.

The semiconductor storage device 20 includes a memory cell array 21, an input/output circuit 22, a logic control circuit 23, a register 24, a sequencer 25, a voltage generator 26, a driver set 27, a row decoder 28, and a sense amplifier module 29.

The memory cell array 21 includes a plurality of blocks BLK (BLK0, BLK1, ... ). Each of the blocks BLK includes a plurality of nonvolatile memory cell transistors (not illustrated) associated with word lines and bit lines. Each of the blocks BLK serves as a data erase unit, and data in the same block BLK is erased together. Each of the blocks BLK includes a plurality of string units SU (SU0, SU1, SU2, ... ). Each of the string units SU is a group of NAND strings NS. Each of the NAND strings NS includes a plurality of memory cell transistors. The number of blocks in the memory cell array 21, the number of string units in each block BLK, and the number of NAND strings in each string unit SU may be set to any number.

The input/output circuit 22 transmits and receives the signal I/O to and from the controller circuit 10. The input/output circuit 22 transfers the command CMD and the address ADD in the signal I/O to the register 24. The input/output circuit 22 transmits and receives the write data and the read data to and from the sense amplifier module 29.

The logic control circuit 23 receives the signals /CE, CLE, ALE, /WE, /RE, and /WP from the controller circuit 10. The logic control circuit 23 also transfers the signal /RB to the controller circuit 10, to notify the outside of the state of the semiconductor storage device 20.

The register 24 retains the command CMD and the address ADD. The register 24 transfers the address ADD to the row decoder 28 and also the sense amplifier module 29, and transfers the command CMD to the sequencer 25.

The sequencer 25 receives the command CMD, and controls the whole semiconductor storage device 20 in accordance with the sequence based on the received command CMD.

The voltage generator 26 generates a voltage necessary for an operation, such as data write, read, and erase, etc., on the basis of the instruction from the sequencer 25. The voltage generator 26 supplies the generated voltage to the driver set 27.

The driver set 27 includes a plurality of drivers, and supplies various voltages from the voltage generator 26 to the row decoder 28 and the sense amplifier module 29, on the basis of the address from the register 24. The driver set 27 supplies various voltages to the row decoder 28, for example, on the basis of the row address in the address.

The row decoder 28 receives the row address in the address from the register 24, and selects a block BLK on the basis of the row address. The voltage from the driver set 27 is transferred to the selected block BLK through the row decoder 28.

In data reading, the sense amplifier module 29 senses the read data read from the memory cell transistor to the bit line, and transfers the sensed read data to the input/output circuit 22. In data writing, the sense amplifier module 29 transfers the write data written through the bit line to the memory cell transistor. The sense amplifier module 29 also receives the column address in the address from the register 24, and outputs data of the column on the basis of the column address.

1.1.4 Structure of Memory Cell Array

Figure 3:
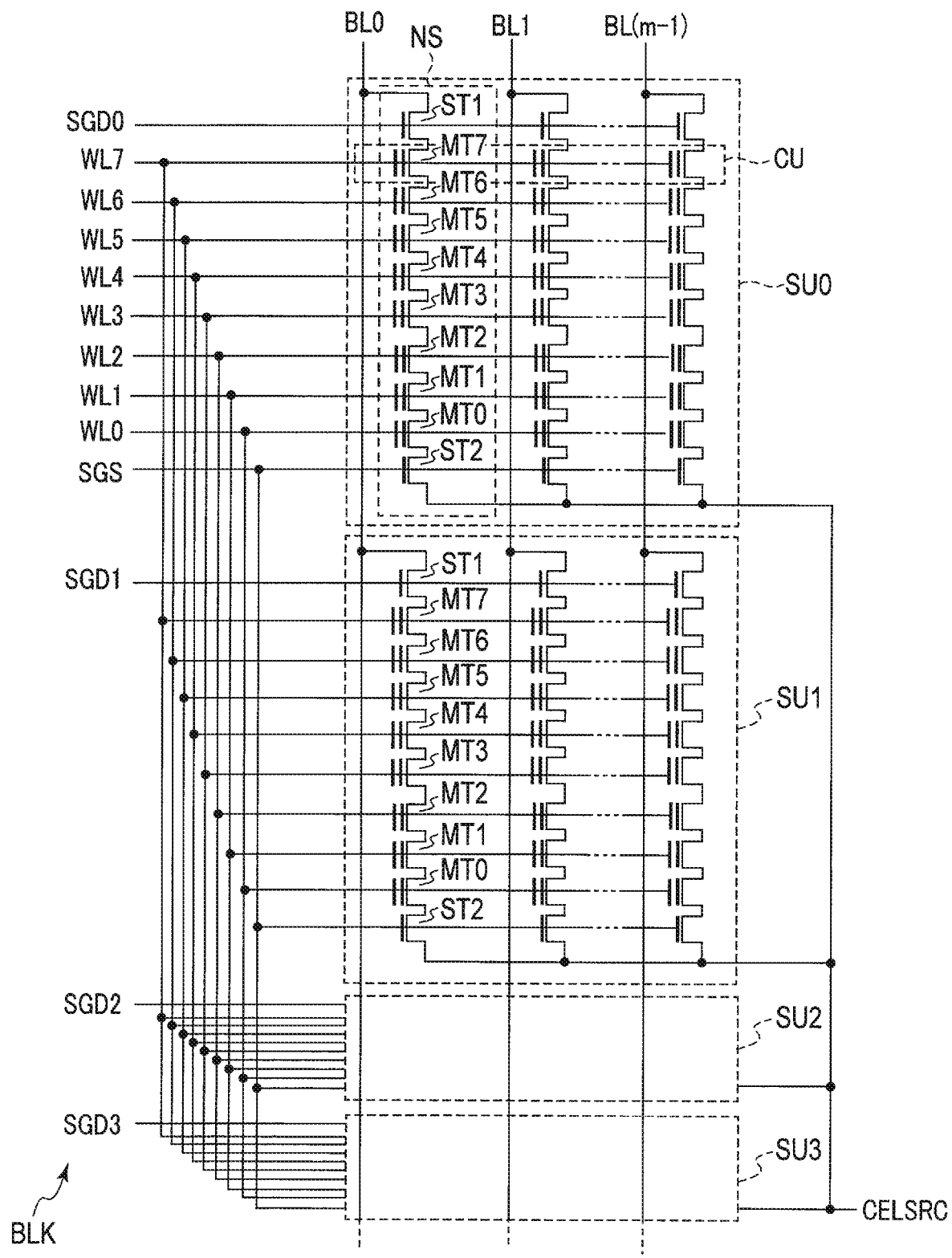
FIG. 3 is a circuit diagram for explaining a configuration of a memory cell array of the semiconductor storage device according to the first embodiment.

The following is explanation of the structure of the memory cell array of the semiconductor storage device according to the first embodiment, with reference to FIG. 3. FIG. 3 is an example of a circuit diagram for explaining the configuration of the memory cell array of the semiconductor storage device according to the first embodiment.

As illustrated in FIG. 3, each of the NAND strings NS includes, for example, eight memory cell transistors MT (MT0 through MT7), a selection transistor ST1, and a selection transistor ST2. The number of memory cell transistors MT is not limited to eight, but may be 16, 32, 64, or 128. The number thereof is not limited. Each of the memory cell transistors MT includes a stacked gate including a control gate and a charge storage layer. The memory cell transistors MT are connected in series between the selection transistors ST1 and ST2. In the following explanation, the term "connect" also includes the case where another conductive element is interposed therebetween.

In a block BLK, gates of the selection transistors ST1 of the string units SU0 through SU3 are connected to selection gate lines SGD0 through SGD3, respectively. In addition, gates of the selection transistors ST2 of all the string units SU in the block BLK are connected in common to a selection gate line SGS. Control gates of the memory cell transistors MT0 through MT7 in the same block SLK are connected to word lines WL0 through WL7, respectively. Specifically, the word lines WL of the same address are connected in common to all the string units SU in the same block BLK, and the selection gate lines SGS are connected in common to all the string units SU in the same block BLK. By contrast, each selected gate line SGD is connected to only one string unit SU in the same block BLK.

Among NAND strings NS arranged in a matrix in the memory cell array 21, the other ends of the selection transistors ST1 of the NAND strings NS in the same column are connected to one of m bit lines BL (BLS through BL(m−1) (m is a natural number)). Each of the bit lines BL is connected in common to NAND strings NS of the same column across a plurality of blocks BLK.

The other ends of the selection transistors ST2 are connected to a source line CELSRC. The source line CELSRC is connected in common to a plurality of NAND strings NS across the blocks BLK.

As described above, data erase is performed together on the memory cell transistors MT in the same block BLK. By contrast, data read and write can be performed together on a plurality of memory cell transistors MT connected in common with one of word lines WL in one string unit SU in one block BLK. Such a group of memory cell transistors MT sharing a word line WL in one string unit SU may be referred to as, for example, cell unit CU. Specifically, a cell unit CU is a group of memory cell transistors MT on which a writing or reading operation can be performed together.

In the present embodiment, for example, one memory cell transistor MT is capable of retaining two-bit data. The two-bit data is referred to as a lower bit and an upper bit, from the lower bit. A group of lower bits included in the group of the memory cell transistors in the same cell unit CU is referred to as "lower page", and a group of upper bits is referred to as "upper page". Specifically, the term "page" may also be defined as part of a memory space formed in the group of the memory cell transistors MT in the same cell unit CU.

Figure 4:
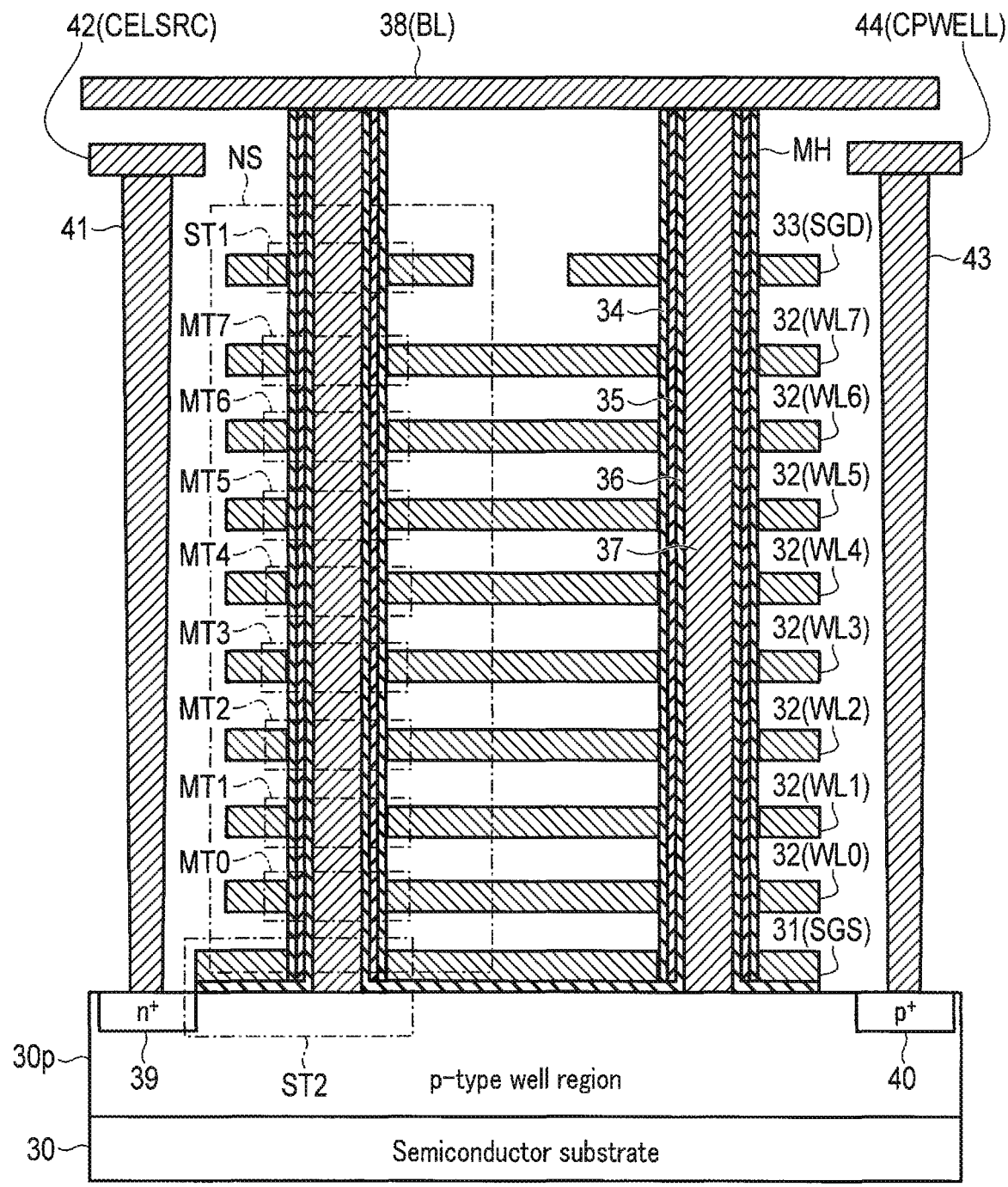
FIG. 4 is a cross-sectional view for explaining the configuration of the memory cell array of the semiconductor storage device according to the first embodiment.

The following is explanation of a cross-sectional structure of the memory cell array 21, with reference to FIG. 4. FIG. 4 illustrates an example of a cross-sectional structure of part of the memory cell array of the semiconductor storage device according to the first embodiment. In particular, FIG. 4 illustrates two NAND strings NS of two string units SU in one block BLK, and a peripheral part thereof. A plurality of structures of the NAND strings NS illustrated in FIG. 4 are arranged in the X direction, for example, and a group of NAND strings NS arranged in the X direction corresponds to one string unit SU.

The semiconductor storage device 20 is provided on a semiconductor substrate 30. In the following explanation, a plane parallel with the surface of the semiconductor substrate 30 is referred to as an XY plane, and a direction perpendicular to the XY plane is referred to as Z direction. The X direction and the Y direction are orthogonal each other.

A p-type well region 30$p$ is provided on an upper portion of the semiconductor substrate 30. A plurality of NAND strings NS provided on the p-type well region 30$p$. Specifically, for example, a wiring layer 31 functioning as the selection gate line SGS, eight wiring layers 32 (WL0 through WL7) functioning as the word lines WL0 through WL7, and wiring layer 33 functioning as the selection gate line SGD are successively stacked on the p-type well region 30$p$. An insulating film (not illustrated) is provided between the stacked wiring layers 31 through 33.

The wiring layer 31 is connected in common with gates of the respective selection transistors ST2 of the NAND strings NS in one block BLK. Each of the wiring layers 32 is connected in common with control gates of the respective memory cell transistors MT of the NAND strings NS in one block BLK. The wiring layer 33 is connected in common with gates of the respective selection transistors ST1 of the NAND strings NS in one string unit SU.

Each of memory holes MH is provided to extend through the wiring layers 33, 32, and 31 and reach the p-type well region 30$p$. A block insulating film 34, a charge storage layer (insulating film) 35, and a tunnel oxide film 36 are successively provided on side surfaces of each memory hole MH. Inside of each memory hole MH is filled with a semiconductor pillar (conductive film) 37. The semiconductor pillar 37 is, for example, non-doped polysilicon, and functions as a current path of the NAND string NS. A wiring layer 38 functioning as the bit line BL is provided on an upper ends of the memory holes MH.

As described above, the selection transistor ST2, the memory cell transistors MT, and the selection transistor ST1 are successively stacked above the p-type well region 30$p$, and one memory hole MH corresponds to one NAND string NS.

An $n^+$ type impurity diffusion region 39 and a $p^+$ type impurity diffusion region 40 are provided in an upper portion of the p-type well region 30$p$. A contact plug 41 is provided on an upper surface of the $n^+$ type impurity diffusion region 39. A wiring layer 42 functioning as the source line CELSRC is provided on an upper surface of the contact plug 41. A contact plug 43 is provided on an upper surface of the $p^+$ type impurity diffusion region 40. A wiring layer 44 functioning as a well line CPWELL is provided on an upper surface of the contact plug 43.

The structure of the memory cell array 21 may be another structure. The structure of the memory cell array 21 is disclosed in, for example, "Three-dimensional stacked non-volatile semiconductor memory" being U.S. patent application Ser. No. 12/407,403 filed on Mar. 19, 2009. It is also disclosed in "Three-dimensional stacked non-volatile semiconductor memory" being U.S. patent application Ser. No. 12/406,524 filed on Mar. 18, 2009, "Non-volatile semiconductor storage device and method for manufacturing the same" being U.S. patent application Ser. No. 12/679,991 filed on Mar. 25, 2010, and "Semiconductor memory and method for manufacturing the same" being U.S. patent application Ser. No. 12/532,030 filed on Mar. 23, 2009. The whole of these patent applications are cited by reference in the specification of the present application.

1.2 Operation

The following is explanation of operations of the memory system according to the first embodiment.

1.2.1 Retained Data and Threshold Distribution of Memory Cell Transistor

Figure 5:
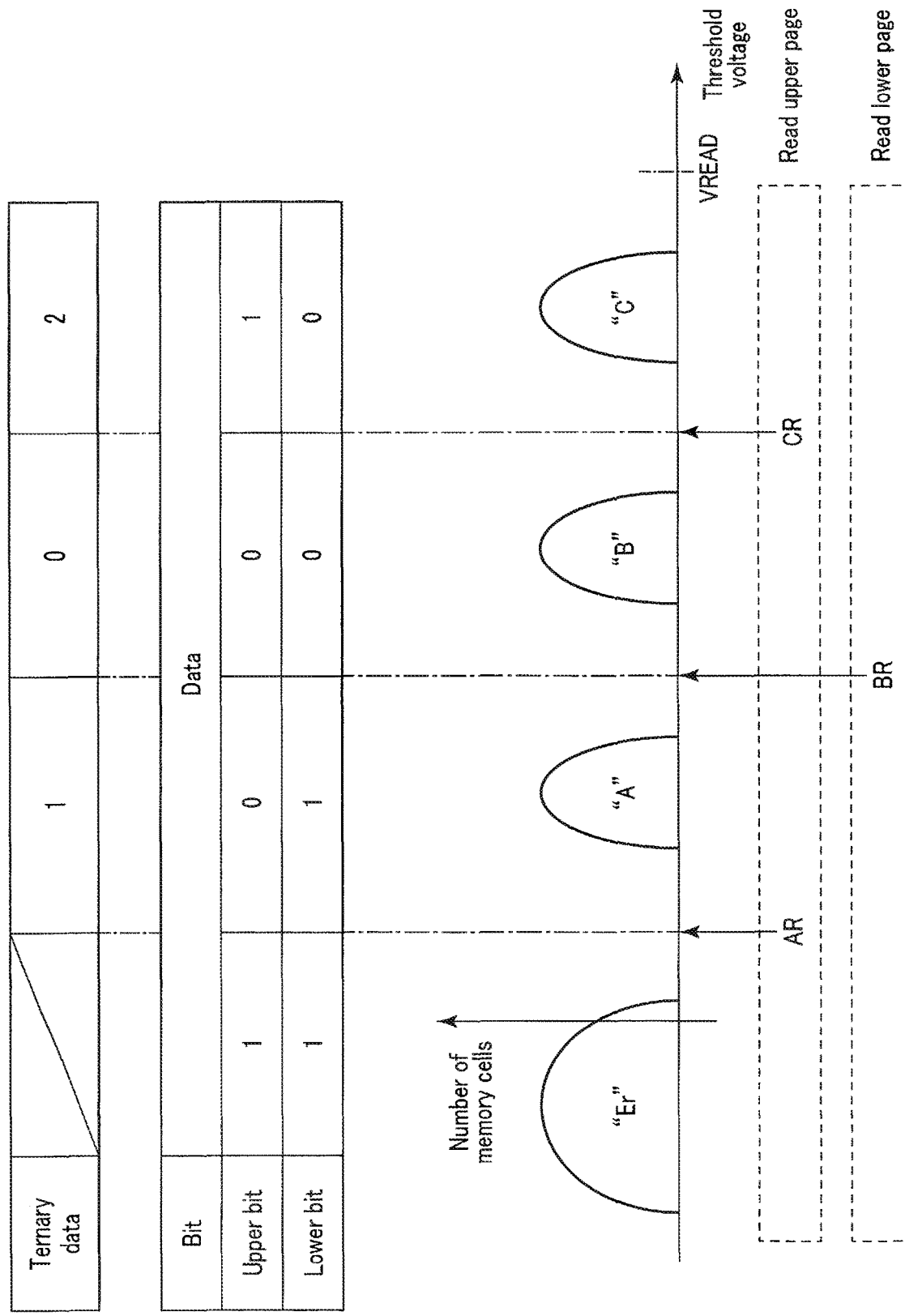
FIG. 5 is a schematic diagram for explaining data that memory cell transistors can take, threshold voltage distribution of the memory cell transistors, and a voltage used for reading the memory cell transistors, according to the first embodiment.

First, the following is explanation of retained data, a threshold voltage, and a reading voltage of each data of the memory cell transistor MT, with reference to FIG. 5. FIG. 5 is a schematic diagram illustrating an example data that memory cell transistors of the semiconductor storage device can take, threshold voltage distribution of the memory cell transistors, and a voltage used in reading thereof, according to the first embodiment. FIG. 5 illustrates an example of the case (MLC: Multi Level Cell) where two-bit data is retained in each memory cell transistor MT in the memory cell array 21.

When the memory cell transistor MT is capable of retaining two-bit data, the memory cell transistor MT is capable of having four states in accordance with the threshold voltage. The four states are referred to as state "Er", state "A", state "B", and state "C", in the order from the lowest threshold voltage.

The threshold voltage of the memory cell transistor MT in the state "Er" is less than voltage AR, and corresponds to a data erase state. The threshold voltage of the memory cell transistor MT in the state "A" is equal to or higher than the voltage AR, and less than voltage BR. The threshold voltage of the memory cell transistor MT in the state "B" is equal to or higher than the voltage BR, and less than voltage CR. The threshold voltage of the memory cell transistor MT in the state "C" is equal to or higher than the voltage CR, and less than voltage VREAD. Among the four states distributed like this, the state "C" is a state with the highest threshold voltage. The voltage VREAD is a voltage applied to non-selected word lines in a reading operation, and turning on the memory cell transistor MT regardless of the retained data.

The threshold voltage distribution is achieved by writing two-bit (two page) data formed of the lower bit and the upper bit described above. Specifically, the relation between the states "Er" to "C" and the lower bit and the upper bit is as follows.

State "Er": "11" (expressed in the order of "upper/lower"
State "A": "01"
State "B": "00"
State "C": "10"

As described above, between data which are corresponding to the two adjacent states in the threshold voltage distribution, only one bit of the two-bit data changes.

Accordingly, when the lower bit is read, the voltage corresponding to the boundary at which the value ("0" or "1") of the lower bit changes should be used. This is the same as for the upper bit.

Specifically, as illustrated in FIG. 5, in a lower page reading operation, the voltage BR dividing the state "A" and the state "B" is used as the reading voltage. In the lower page reading operation, it is determined whether the threshold voltage of the memory cell transistor MR is less than the voltage BR.

In the upper page reading operation, the voltage AR distinguishing the state "Er" and the state "A", and the voltage CR distinguishing the state "B" and the state "C" are used as the reading voltage. The upper page reading operation includes an operation to determine whether the threshold voltage of the memory cell transistor MT is less than the voltage AR, and an operation to determine whether the threshold voltage of the memory cell transistor MT is less than the voltage CR.

In the first embodiment, data is written to the memory cell transistor MT such that the threshold voltage is not distributed into the state "Er", among the four states described above, and data is read from the memory cell transistor MT with the threshold voltage that is not distributed into the state "Er". In the first embodiment, writing and reading are performed without using the state "Er". For this reason, ternary data are further associated with the states "A" through "C" excluding the state "Er" among the four states described above.

In the following explanation, data indicated with "Δ" (Δ is an any positive number) (such as "10") indicates binary data, and data indicated with 'Δ' (such as '2') indicates ternary data. In addition, data indicated with <Δ> (such as <Δ>) indicates decimal data. In the following explanation, data "10", '2', and <2> are data indicating the same quantity, but they are distinguished from each other.

In the example of FIG. 5, the states "A", "B", and "C" are further associated with '1', '0', and '2', respectively. The association of the binary data and the ternary data with the threshold voltage distribution are retained as a conversion table, for example, in the memory 12 within the controller circuit 10. Data is basically retained as binary data in the controller circuit 10 and the semiconductor storage device 20. For this reason, the conversion table is not always stored as ternary data, but it suffices that information corresponding to the ternary data is stored as data of any radix (such as binary digit).

1.2.2 Reading Operation

Figure 6:
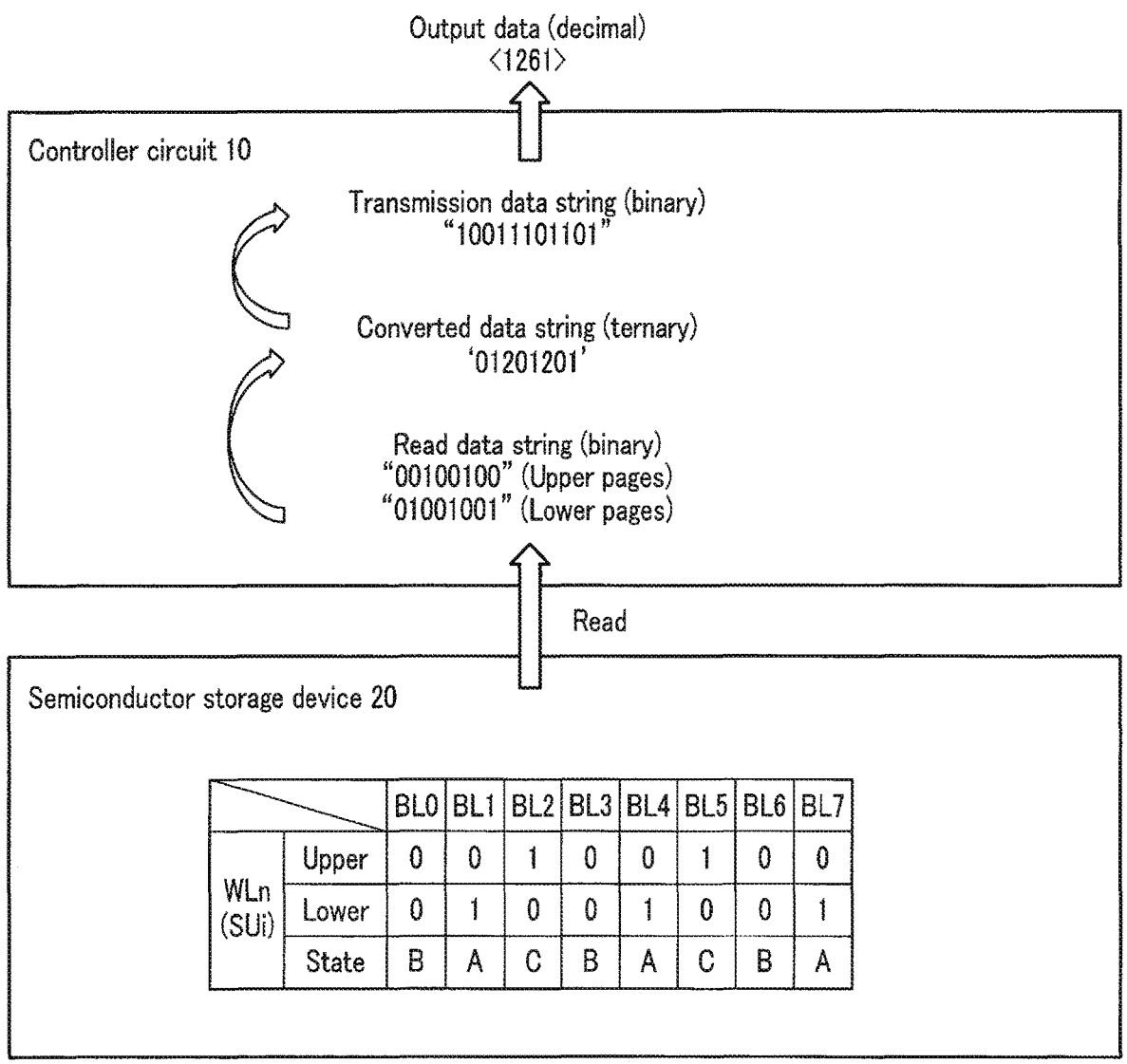
FIG. 6 is a schematic diagram for explaining a reading operation in the memory system according to the first embodiment.

The following is explanation of a reading operation in the memory system according to the first embodiment, with reference to FIG. 6.

FIG. 6 schematically illustrates a state in which data written to the cell unit CU in the semiconductor storage device 20 without using the state "Er" is output to the host apparatus through the controller circuit 10. More specifically, FIG. 6 illustrates the case where decimal data "1261" is output to the host apparatus, as an example.

As illustrated in FIG. 6, the processor 11 issues a command to read data written to each page in the same cell unit CU to the semiconductor storage device 20 through the NAND interface circuit 14. When the semiconductor storage device 20 receives the command, the semiconductor storage device 20 reads data from each page in the same cell unit CU in the memory cell array 21.

Specifically, for example, in response to the command, the sequencer 25 designates the cell unit CU connected to nth word line WLn in the ith string unit SUi in one block BLK, as the reading target (each of n and i is an integer of 0≤n≤7 and 0≤i≤3). In the example of FIG. 6, the threshold voltages of the memory cell transistors MT connected to the bit lines BL0 through BL7 in the cell unit CU are in states "B", "A", "C", "B", "A", "C", "B", and "A", respectively. For this reason, the sequencer 25 controls the units 26 through 29, to read out the read data string "00100100" from the upper page of the memory cell transistors MT in the cell unit CU, and read out the read data string "01001001" from the lower page.

As described above, no memory cell transistor MT in the state "Er" exists in the cell unit CU. For this reason, in reading of the upper page, the semiconductor storage device 20 substantially determines the upper bits, not depending on the reading voltage AR (on the basis of the reading result with the reading voltage CR).

The processor 11 receives the two read data strings "00100100" and "01001001" output from the input/output circuit 22 from the semiconductor storage device 20, through the NAND interface circuit 14.

The processor 11 generates one ternary data string '01201201' from the two read data strings "00100100" and "01001001", on the basis of the conversion table of the binary data and the ternary data retained in the memory 12. Specifically, the processor 11 converts, for example eight pieces of binary data obtained by combining values of the corresponding digits of the two read data strings "00100100" and "01001001" into eight pieces of ternary data.

More specifically, the processor 11 combines pieces of data of the uppermost digits of the two read data strings "00100100" and "01001001" to generate "00", combines pieces of data of the second digits thereof to generate "01", and combines pieces of data of the third digits thereof to generate "10". In the same manner, the processor 11 combines pieces of data of the fourth through eighth digits of the two read data strings "00100100" and "01001001", to generate "00", "01", "10", "00", "01", "10", "00", and "01".

Thereafter, the processor 11 converts each of the obtained eight pieces of two-digit binary data into one-digit ternary data, and combines the eight pieces of one-digit ternary data into one eight-digit ternary data. Specifically, the processor 11 converts the pieces of binary data "00", "01", and "10" into pieces of ternary data '0', '1', and '2'. Thereafter, the processor 11 combines the converted ternary data in the order of the bit of the read data string, to obtain a converted data string '01201201'.

The processor 11 converts the converted data string '01201201' into a binary transmission data string "10011101101".

The processor 11 outputs the obtained transmission data string "10011101101" to the host apparatus, through the host interface circuit 16. The host apparatus converts the transmission data string "10011101101" into decimal data, to obtain <1261>.

With the operation described above, data is read from the semiconductor storage device 20, without using the state "Er".

1.2.3 Writing Operation

Figure 7:
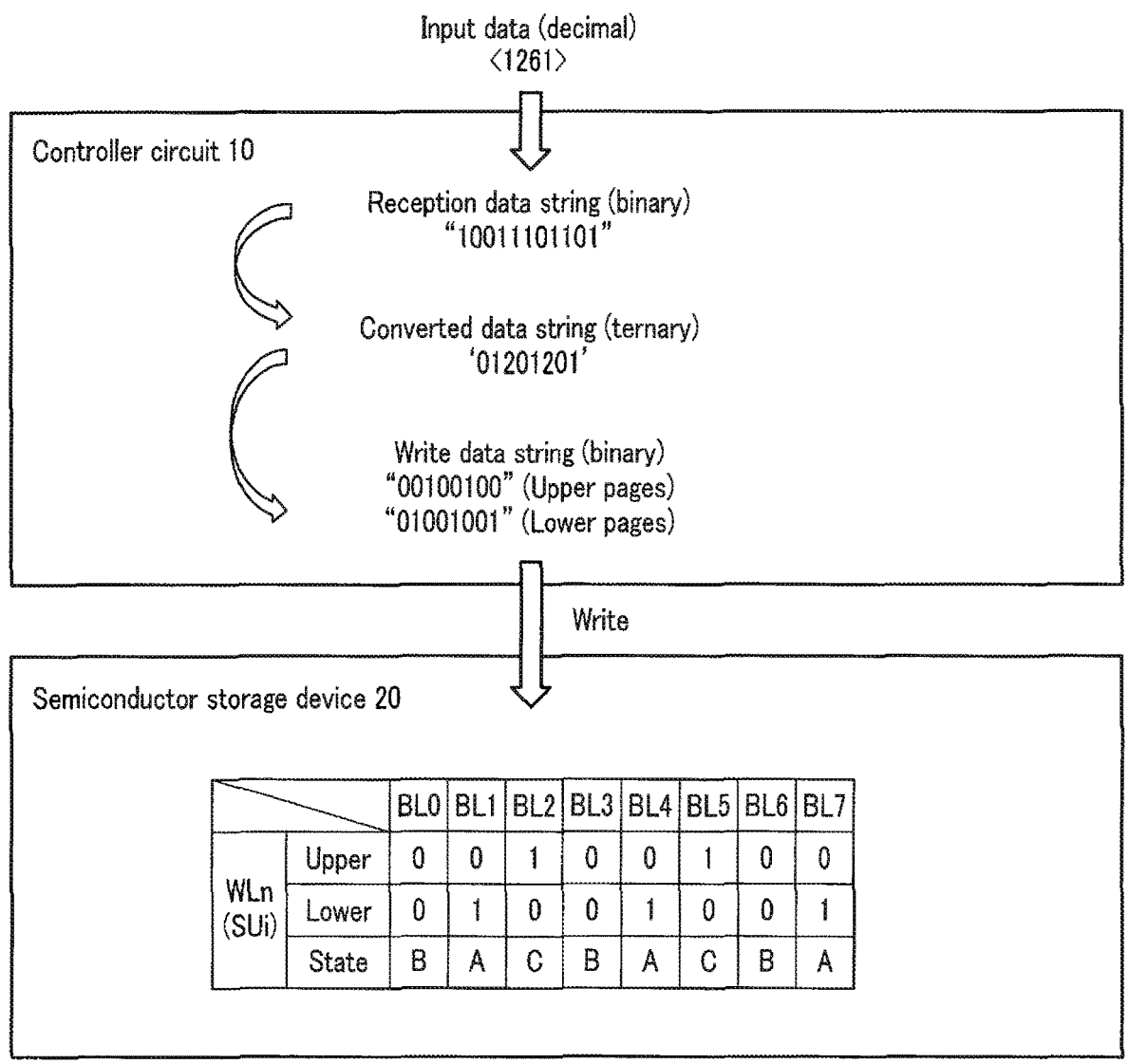
FIG. 7 is a schematic diagram for explaining a writing operation in the memory system according to the first embodiment.

The following is explanation of the writing operation in the memory system according to the first embodiment, with reference to FIG. 7.

FIG. 7 schematically illustrates the state in which data input from the host apparatus is written to the cell unit CU in the semiconductor storage device 20, through the controller circuit 10, without using the state "Er". More specifically, FIG. 7 illustrates the case where decimal data <1261> is input from the host apparatus, as an example. Suppose that the memory cell transistor MT before data is written is in the state "Er".

As illustrated in FIG. 7, the memory system 1 receives a command to write decimal input data <1261> from the host apparatus. Specifically, the processor 11 receives the input data <1261> as binary reception data string "10011101101" from the host apparatus, through the host interface circuit 16.

The processor 11 converts the reception data string "10011101101" into a ternary converted data string '01201201'.

Thereafter, the processor 11 generates two binary write data strings "00100100" and "01001001" from the converted data string '01201201', on the basis of the conversion table of the binary data and the ternary data retained in the memory 12. Specifically, the processor 11 converts, for example, eight pieces of ternary data corresponding to the values of the respective digits of the converted data string '01201201' into eight pieces of two-digit binary data.

More specifically, the processor 11 converts the data "0" serving as the uppermost digit of the converted data string '01201201' into "00", converts data '1' serving as the second digit into "01", and data '2' serving as the third digit into "10". In the same manner, the processor 11 converts data '0' serving as the fourth digit of the converted data string '01201201', data '1' serving as the fifth digit, data '2' serving as the sixth digit, data '0' serving as the seventh digit, and data '1' serving as the eighth digit into "00", "01", "10", "00", and "01", respectively.

The processor 11 successively arranges the upper bits of the obtained eight pieces of two-digit binary data ("00", "01", "10", "00", "01", "10", "00", and "01") in order, to generate the first write data string "00100100". The processor 11 also successively arranges the lower bits of the obtained eight pieces of two-digit binary data in order, to generate the second write data string "01001001". The obtained two write data strings are, for example, data strings written to the same cell unit CU. Specifically, the first write data string "00100100" described above corresponds to the write data string for the upper page, and the second data string "01001001" described above corresponds to the write data string for the lower page.

The processor 11 issues a command to write the obtained two write data strings "00100100" and "01001001" to the same cell unit CU to the semiconductor storage device 20, through the NAND interface circuit 14. When the semiconductor storage device 20 receives the command, the semiconductor storage device 20 writes data based on the two write data strings described above to the same cell unit CU in the memory cell array 21.

Specifically, for example, the sequencer 25 designates the cell unit CU connected to nth word line WLn in the ith string unit SUi in one block BLK, as the reading target (each of n and i is an integer of 0≤n≤7 and 0≤i≤3). The sequencer 25 controls the units 26 through 29, to write the write data string "00100100" to the upper page of the memory cell transistors MT in the cell unit CU, and write the write data string "01001001" from the lower page.

In this manner, for example, data "0" is written to the upper page and "0" is written to the lower page in the memory cell transistors MT connected with the bit lines BL0, BL3, and BL6. Data "0" is written to the upper page and "1" is written to the lower page in the memory cell transistors MT connected to the bit lines BL1, BL4, and BL7. Data "1" is written to the upper page and "0" is written to the lower page in the memory cell transistors MT connected to the bit lines BL2 and BL5. For this reason, the threshold voltage states of the memory cell transistors MT connected to the bit lines BL0 through BL7 in the cell unit CU are states "B", "A", "C", "B", "A", "C", "B", and "A", respectively.

In the writing operation, the sequencer 25 increases the threshold voltage from the state "Er", for each of all the memory cell transistors MT in the cell unit CU. Specifically, in writing to the cell unit CU, data is written in a state in which all the bit lines BL are released from an inhibit state.

With the operation as described above, data is written to the cell unit CU in the semiconductor storage device 20 such that the "Er" state is removed.

The example of FIG. 7 illustrates the case of writing data with which the threshold voltages of the memory cell transistors MT in the same cell unit CU are uniformly distributed to states "A" through "C", but the structure is not limited thereto. For example, even when the threshold voltages in the cell unit CU are not uniformly distributed to states "A" through "C" only with one write data, the controller circuit 10 is capable of performing adjustment such that the threshold voltages in the cell unit CU are uniformly distributed to states "A" through "C", in combination with another write data. This adjustment removes nonuniformity in threshold voltage distribution in the cell unit CU, and suppresses deterioration in error correction capability.

1.2.4 Tracking Operation

The following is explanation of a tracking operation in the memory system according to the first embodiment.

1.2.4.1 Outline of Tracking Operation

First, the following is explanation of an outline of a Vth tracking operation, as an example of the tracking operation executed in the memory system according to the first embodiment.

In FIG. 5 explained above, threshold voltage distributions of respective pieces of data are independent of each other. For this reason, correct data can be read out by setting the reading voltage between threshold voltage distributions of respective pieces of data.

Figure 8:
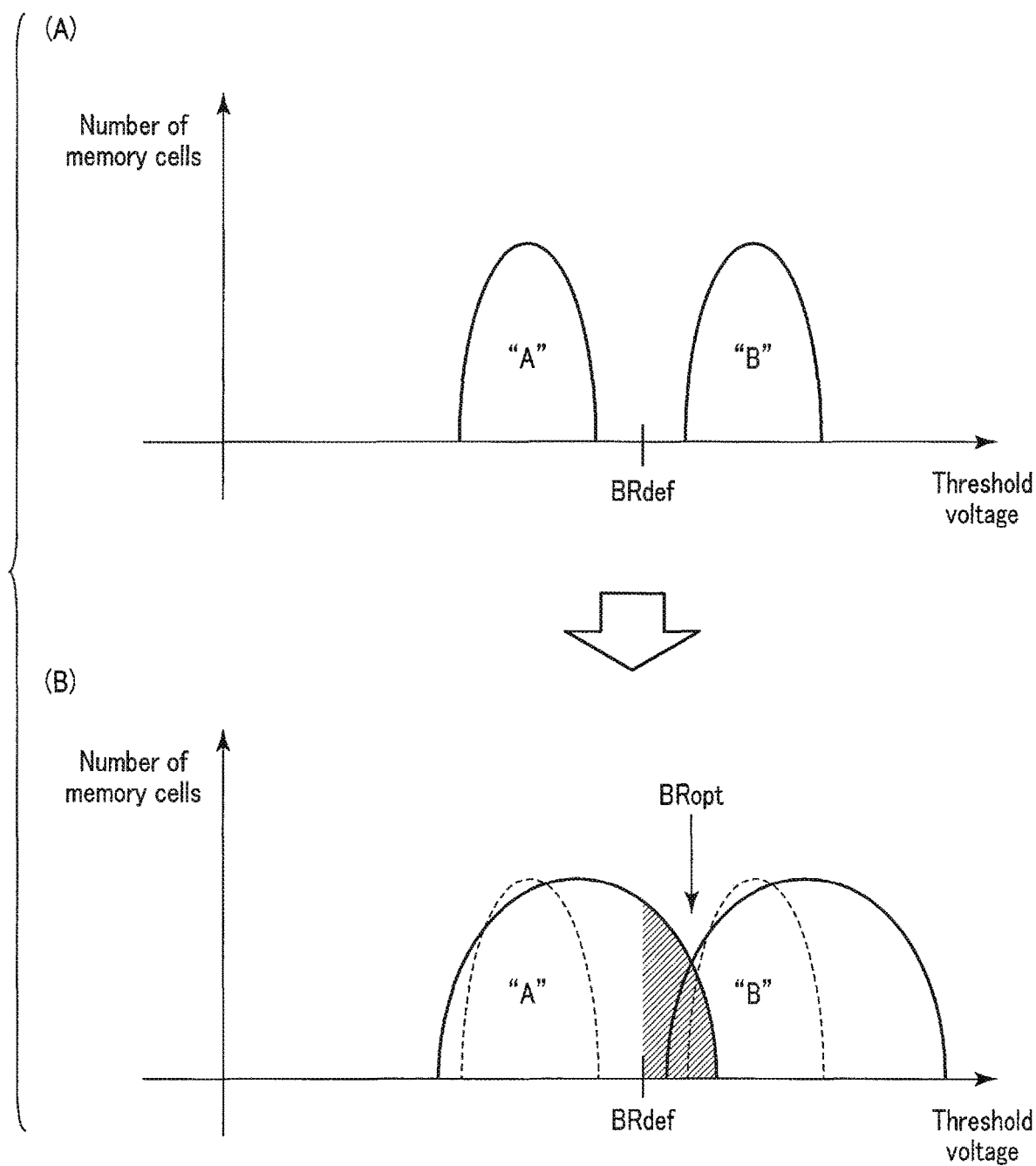
FIG. 8 is a schematic diagram for explaining a fluctuation of threshold voltage distribution in the memory system according to the first embodiment.

However, for various factors, the threshold voltage of the memory cell transistor MT may fluctuate. As a result, each of the threshold voltage distributions of data in FIG. 5 may have a larger width, or may move, and the adjacent distributions may overlap. FIG. 8 illustrates such a state.

For example, directly after writing, the threshold voltage distributions of the states "A" and "B" are as illustrated in FIG. 8(A). However, due to causes such as disturb, suppose that the threshold voltage distributions are widened as illustrated in FIG. 8(B). In this state, when reading is performed with reading voltage BRdef originally set, the read data of the memory cell transistor MT corresponding to a hatched region becomes an error. When the number of error bits exceeds the error correctable bit number of the ECC circuit 13, proper correction of the data is impossible.

In such a case, it is desirable to set a voltage (for example, a voltage BRopt with the least overlap of the threshold voltage distributions) with a smaller overlap of the threshold voltage distributions of the two levels, as new reading voltage, to reduce the number of error bits.

Figure 9:
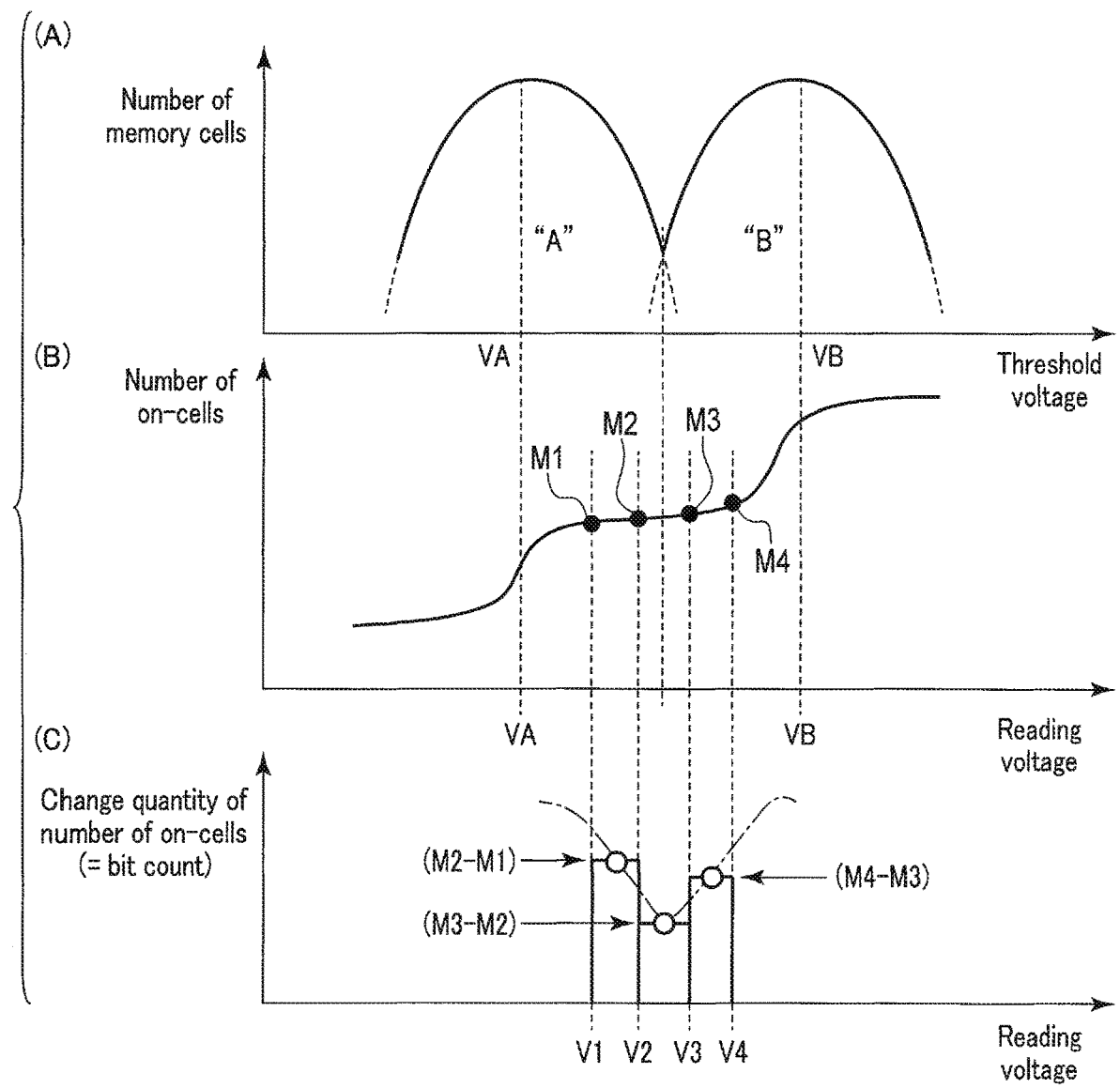
FIG. 9 is a schematic diagram for explaining a tracking operation in the memory system according to the first embodiment.

FIG. 9 is a schematic diagram for explaining Vth tracking. FIG. 9(A) is a graph illustrating threshold voltage distributions of the state "A" and the state "B", as an example of distributions of the threshold voltages of the memory cell transistors MT. FIG. 9(B) is a graph illustrating change of the number (the number of on-cells) of memory cells changed to an on-state for a certain reading voltage. FIG. 9(C) is a histogram illustrating the change quantity (bit count) of the number of on-cells in the range of the reading voltage. FIG. 9(B) and FIG. 9(C) are plotted to correspond to the memory cell transistors MT having the threshold voltage distributions of FIG. 9(A).

As illustrated in FIG. 9(B), when the reading voltage is increased, the number of on-cells rapidly increases at a voltage slightly smaller than the voltage VA serving as the median of the state "A", and dM/dV becomes maximum. The median is a voltage with the highest probability of the threshold voltage distribution in FIG. 9(A), M represents the number of on-cells, and V represents the reading voltage to be applied to the selected word line WL. When the reading voltage is increased more, the increase rate of the number of on-cells reduces, and has the minimum value at a certain value. The increase rate in the reading voltage becomes zero, when the threshold voltage distribution of the state "A" does not overlap the threshold voltage distribution of the state "B". By contrast, when the threshold voltage distributions overlap, the increase rate has a certain minimum value (>0) that is not zero. Thereafter, when the reading voltage is further increased, the increase rate of the number of on-cells increases again, and dM/dV becomes maximum again at a voltage slightly smaller than voltage VB serving as the median of the state "B".

Change in the cumulative value of the number of on-cells enables detection of the position serving as a valley between the two levels, that is, the position of the reading voltage with the least overlap of the threshold voltage distributions of the two levels. For example, first, a reading operation is performed using a reading voltage V1. The number of on-cells in the reading operation is M1. Thereafter, a reading operation is performed using a voltage V2 larger than the voltage V1 by ΔV. The number of on-cells in the reading operation is M2. In view of the above, the number of memory cell transistors MT that are newly turned on when the reading voltage applied to the selected word line WL increases from V1 to V2 is (M2−M1).

Thereafter, a reading operation is performed using voltage V3 larger than the voltage V2 by ΔV. The number of on-cells in the reading operation is M3. In view of the above, the number of memory cell transistors MT that are newly turned on when the reading voltage applied to the selected word line WL increases from V2 to V3 is (M3−M2). In addition, when "(M2−M1)>(M3−M2)" is satisfied, the voltage at which dM/dV is minimum is considered to be at least higher than the voltage V2.

Thereafter, a reading operation is performed using voltage V4 larger than the voltage V3 by ΔV. The number of on-cells in the reading operation is M4. When "(M3−M2)<(M4−M3)" is satisfied, a histogram as illustrated in FIG. 9(C) is obtained.

With the result described above, the threshold voltage distribution as illustrated with a dashed line in FIG. 9(C) can be estimated, on the basis of the change quantity of the number of on-cells, and it can be estimated that the valley between the state "A" and the state "B" is located between the voltage V2 and the voltage V3.

The change quantity (bit count) of the number of on-cells is extracted by, for example, changing the reading voltage and tracking the state of change of the number of bits of the data read from one cell unit CU. These operations are generally called Vth tracking.

1.2.4.2 Distribution of Bit Counts

Figure 10:
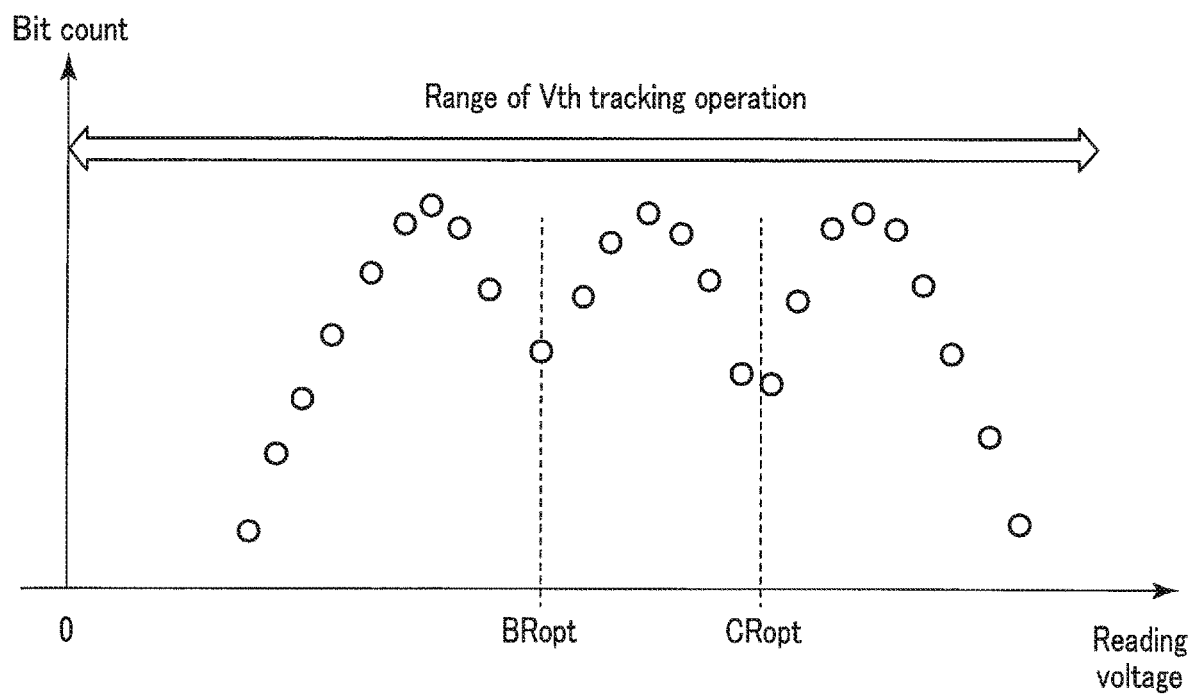
FIG. 10 is a schematic diagram for explaining bit count distribution obtained by the tracking operation in the memory system according to the first embodiment.

The following is explanation of distribution of the bit count obtained by Vth tracking operation in the memory system according to the first embodiment, with reference to FIG. 10. FIG. 10 illustrates an example of a bit count distribution obtained by executing Vth tracking operation on the memory cell transistors MT, to which data has been written, in the memory system according to the first embodiment.

As described above, when the writing operation is performed in the first embodiment, the threshold distributions of the memory cell transistors MT are distributed into the state "A" through state "C", and not distributed into the state "Er". For this reason, as illustrated in FIG. 10, the distribution of the bit count forms three peaks corresponding to the state "A" through the state "C".

When the threshold voltage distributions overlap between adjacent levels, a valley position with the minimum bit count is formed in two positions, that is, a position between the state "A" and the state "B", and a position between the state "B" and state "C". In this manner, reading voltages BRopt and CRopt after tracking can be estimated as optimum values of the reading voltages BR and CR. No "Er" state exists in the cell unit CU in which the writing operation is executed in the first embodiment. With the structure, because no valley position is formed between the state "Er" and the state "A", no reading voltage ARopt after tracking is estimated.

In the Vth tracking operation, the reading voltage in a range of 0 V or more is applied. As described above, the cell unit CU includes only memory cell transistors M having the threshold voltages of the state "A" or more. This structure enables check of distributions of the threshold voltages for all the memory cell transistors MT subjected to reading with the Vth tracking operation. Specifically, the total number of obtained bit counts agrees with the total number of memory cell transistors MT subjected to the Vth tracking operation.

1.3 Effect of the Present Embodiment

The first embodiment improves the reliability of the retained data. The following is explanation of the effect.

Increase in the number of writes and reads causes a phenomenon in which the charges accumulated in the charge cumulative layer move to a charge cumulative layer of another memory cell transistor. Because this causes fluctuations in the threshold voltage, a tracking operation is performed in data reading, to detect an optimum reading voltage.

Figure 11:
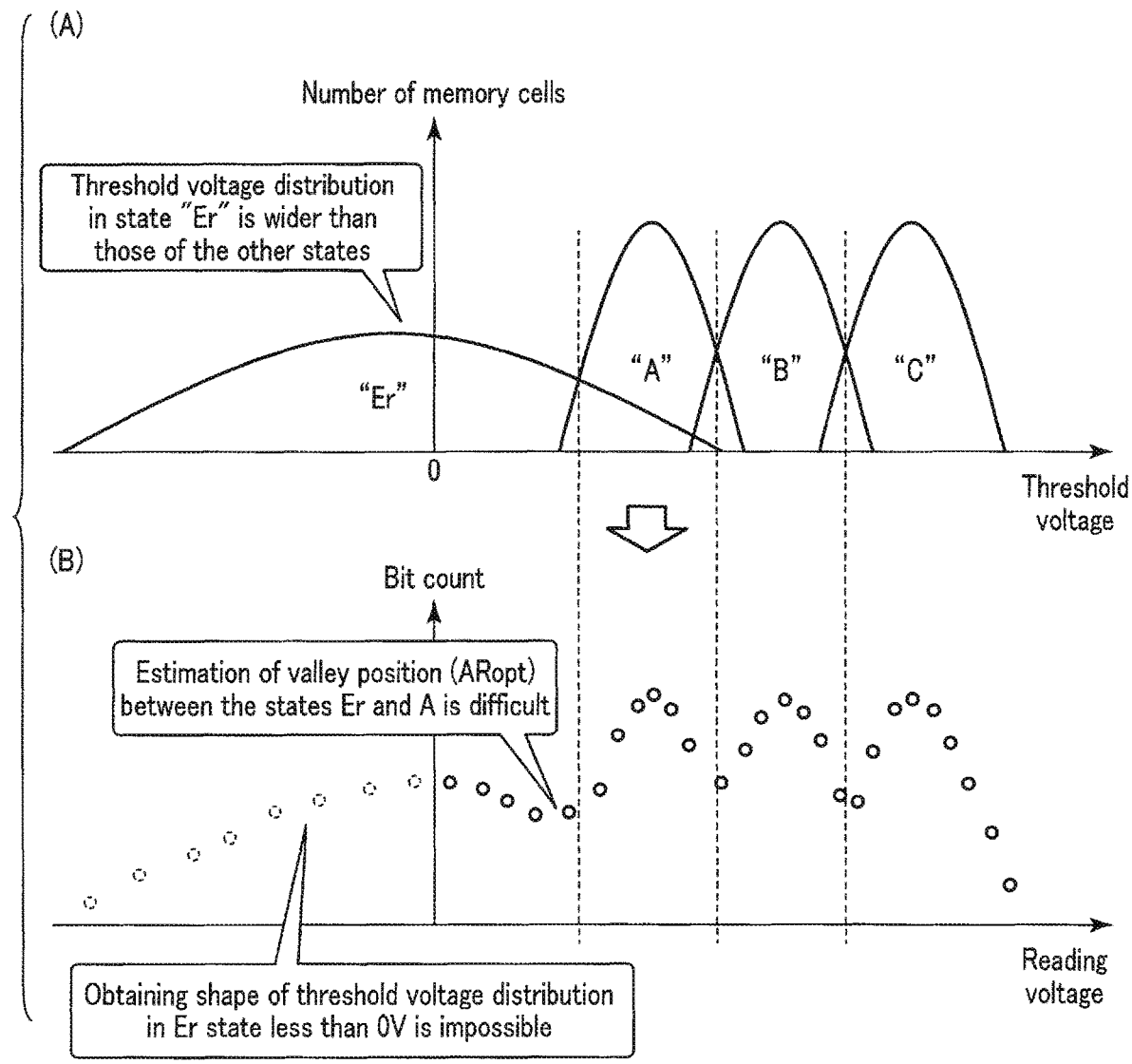
FIG. 11 is a schematic diagram for explaining a tracking operation in a memory system according to a comparative example.
Figure 12:
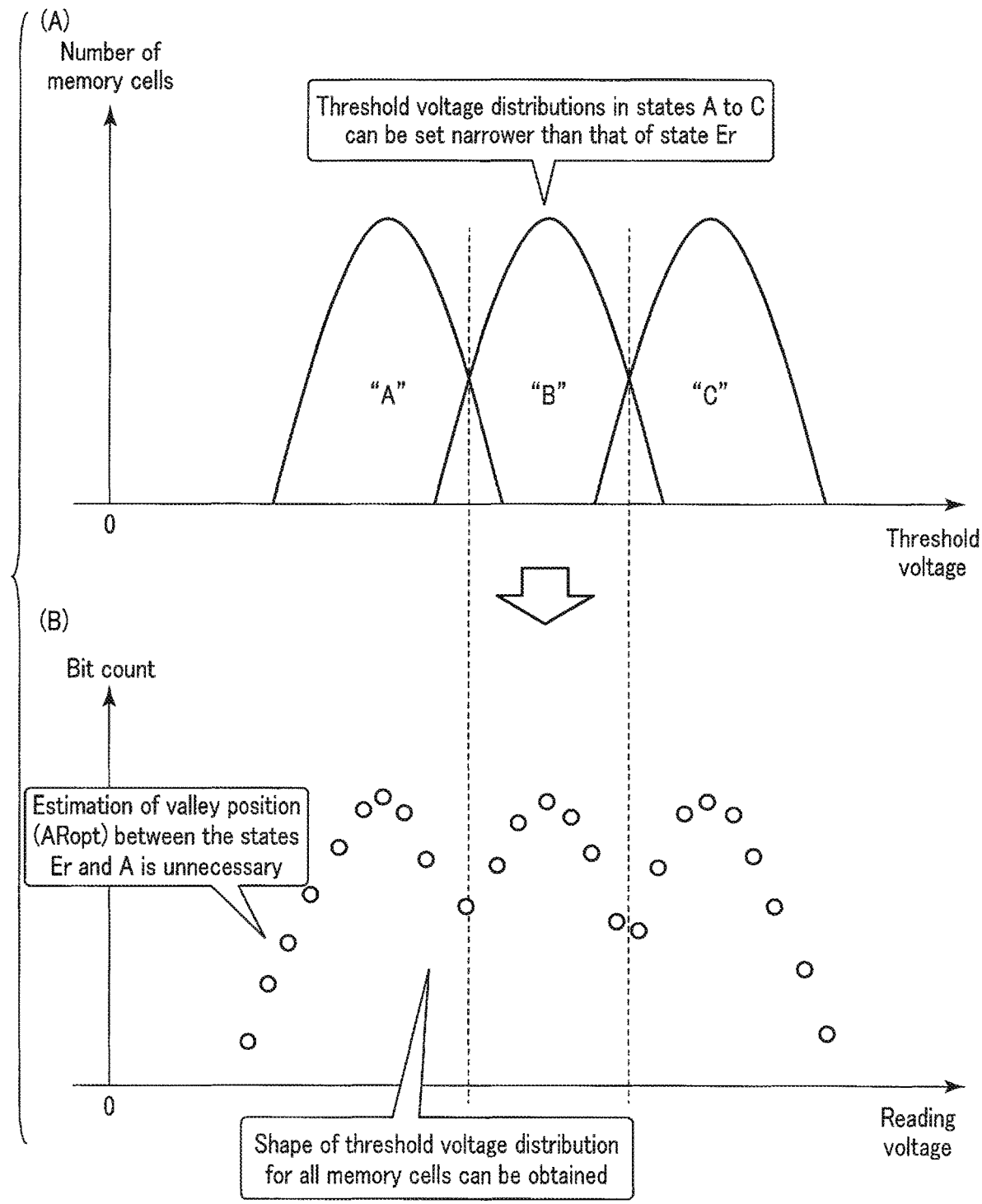
FIG. 12 is a schematic diagram for explaining an effect produced with the memory system according to the first embodiment.

FIG. 11 is a schematic diagram for explaining the tracking operation in a comparative example. FIG. 11(A) illustrates the state in which the threshold voltages are distributed into four states including the state "Er". FIG. 11(B) illustrates the state in which a bit count distribution in the case where the Vth tracking operation is performed on the cell unit with the threshold voltage distributions illustrated in FIG. 11(A). FIG. 12 is a schematic diagram for explaining the effect produced by the memory system according to the first embodiment.

As illustrated in FIG. 11, the state "Er" depends on variations of the characteristic value occurring in manufacturing, the threshold voltage may vary between the memory cell transistors. In this manner, the threshold voltage distribution of the state "Er" may have a relatively large width in comparison with the other states. In addition, as described above, the Vth tracking operation uses the reading voltage of 0 V or more. In this manner, calculating the bit count is difficult for the portion in which the threshold voltage is negative in the memory cell transistor in the state "Er". This causes difficulty in detecting the valley position between the state "Er" and the state "A", and estimating an optimum reading voltage ARopt.

In the first embodiment, as illustrated in FIG. 12, a writing operation is executed such that the threshold voltage of each of the memory cell transistors MT is positive, in writing of two-bit data to the same cell unit CU. In this manner, execution of the Vth tracking operation enables acquisition of the bit count distributions for all the memory cell transistors.

In addition, the memory cell transistor MT in a state in which data is written thereto has one of the three states of "A" through "C". This structure removes the necessity for distinguishing the state "Er" from the state "A", removes the necessity for estimation of the reading voltage ARopt, and suppresses erroneous detection of data. Besides, the threshold voltage distributions of the states "A" through "C" can be narrowed, by regulating the number of writes and the writing voltage. This structure enables distribution of the threshold voltage of the memory cell transistor MT to achieve threshold voltage distribution forming a steeper peak than that in the state "Er". This structure improves the reliability of the retained data.

In an operation of reading the upper page, the semiconductor storage device 20 substantially determines the upper bits, on the basis of a reading result with the reading voltage CR, not on the basis of a reading result with the reading voltage AR. In an operation of reading the lower page, the semiconductor storage device 20 determines the data, on the basis of a reading result with the reading voltage BR. Specifically, the semiconductor storage device 20 determines the two-bit data by a reading operation using two reading voltages, in reading of data from the memory cell transistor MT to which data has been written without using the state "Er". The controller circuit 10 generates data corresponding to the ternary data string, on the basis of the data string of the two-bit data determined in each cell unit CU, and outputs the data to the host apparatus. This structure enables the controller circuit 10 to read information without excess or shortage, from the memory cell transistor MT to which data has been written without the state "Er".

2. Second Embodiment

The following is explanation of a memory system according to the second embodiment. The second embodiment illustrates an operation in which application of the reading voltage AR is omitted in the upper page reading operation. In the following description, explanation of structures and operations that are the same as those in the first embodiment are omitted, and structures and operations different from those of the first embodiment will be mainly explained.

2.1 Reading Operation

The following is explanation of a reading operation in the memory system according to the second embodiment.

2.1.1 Command Sequence

Figure 13:
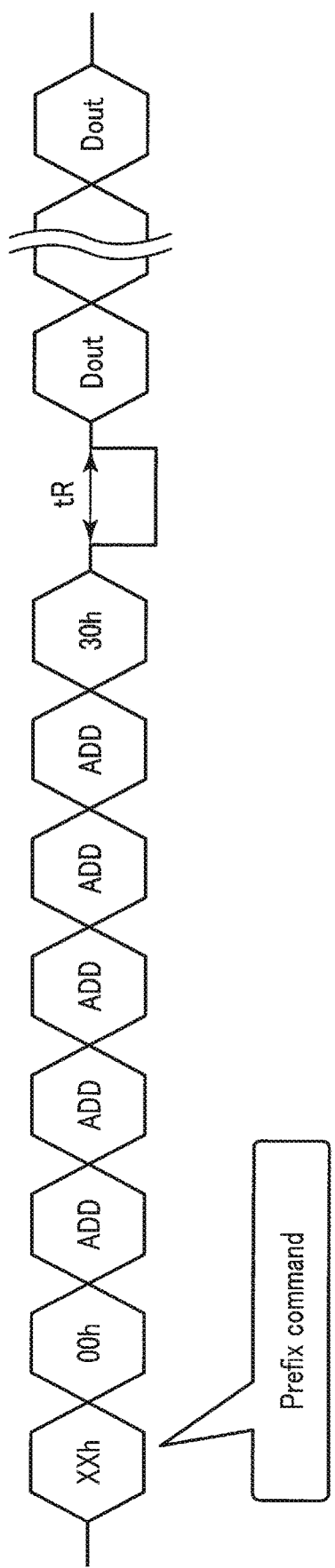
FIG. 13 is a command sequence for explaining a reading operation in a memory system according to a second embodiment.

First, the following is explanation of an example of a command sequence of the reading operation in the memory system according to the second embodiment, with reference to FIG. 13.

As illustrated in FIG. 13, the controller circuit 10 issues a prefix command "XXh". The command "XXh" is a command to announce that reading of data written without using the state "Er", for the semiconductor storage device 20 by the controller circuit 10. Thereafter, the controller circuit 10 issues a first read command "00h", and thereafter issues an address (including the column address, the block address, and the page address), for example, for five cycles. Thereafter, the controller circuit 10 issues a second read command "30h".

When the command "30h" is stored in the register 24, the sequencer 25 controls the units 26 through 29, to start a reading operation for the data written without using the state "Er". The logic control circuit 23 changes the signal /RB to the level "L", to notify the controller circuit 10 that the semiconductor storage device 20 is in the busy state. During the reading operation (illustrated as period "tR" in FIG. 13), data for one page is read from the region corresponding to the address transmitted from the controller circuit 10. The logic control circuit 23 changes the signal /RB to the level "H", to notify that the semiconductor storage device 20 is in the ready state.

When the semiconductor storage device 20 becomes the ready state, the controller circuit 10 repeatedly asserts the signal /RE. Each time the signal /RE is toggled, data read from the memory cell array 21 is transmitted to the controller circuit 10.

With the operation described above, a reading operation for the data written without using the state "Er" is performed.

When the subsequent reading operation is executed without issuing a command "XXh", a reading operation for the data written using the state "Er" is performed as usual. For example, the controller circuit 10 may store information to determine, for each cell unit CU, whether the written data is data written using the state "Er", as a table. This structure enables the controller circuit 10 to recognize the type of the data written to the cell unit CU, with reference to the table.

2.1.2 Timing Chart

Figure 14:
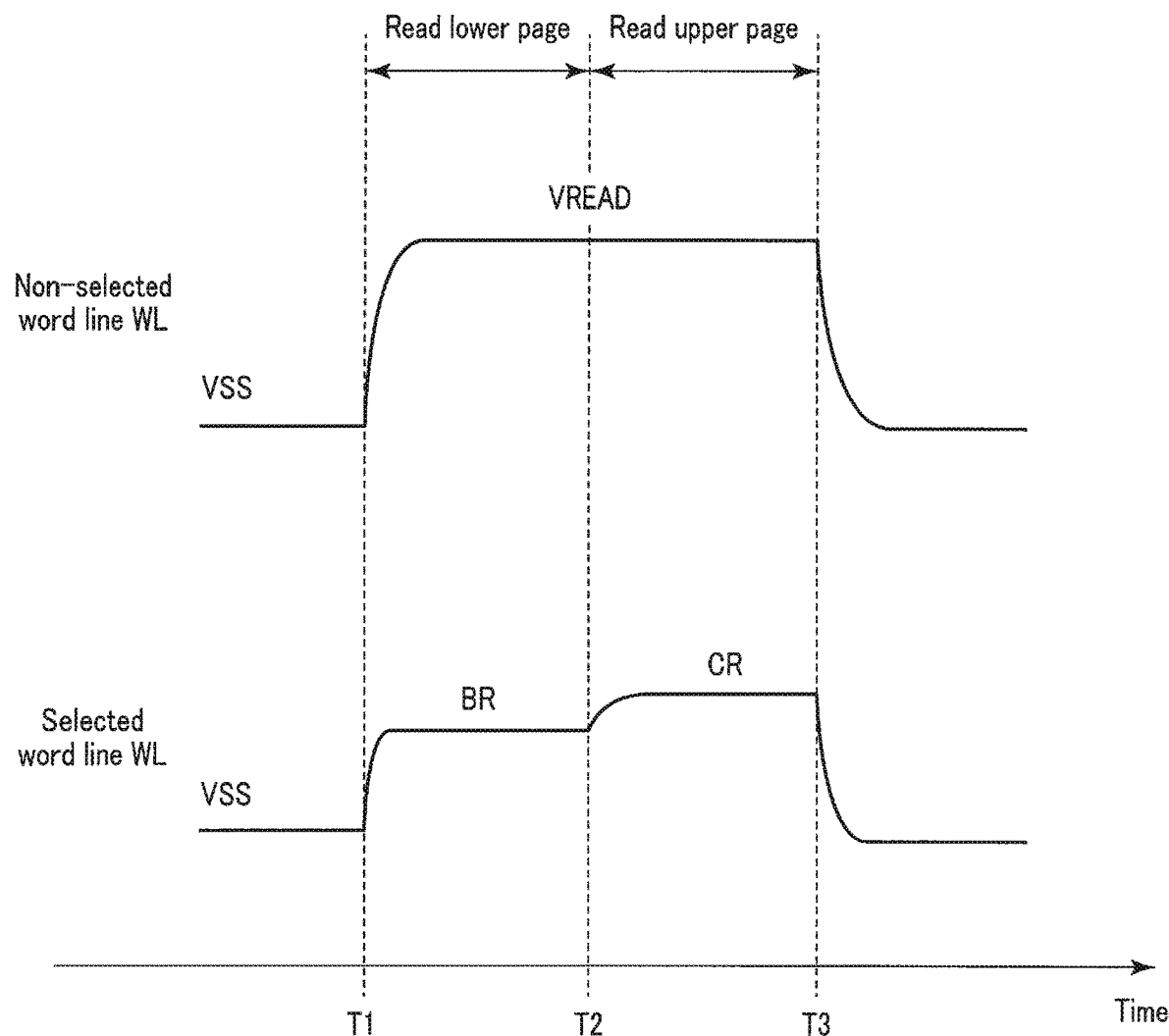
FIG. 14 is a timing chart for explaining the reading operation in the memory system according to the second embodiment.

The following is explanation of an example of a timing chart of the reading operation in the memory system according to the second embodiment, with reference to FIG. 14.

As illustrated in FIG. 14, from time T1 through time T3, a reading operation for the NAND string NS connected to a certain bit line BL is performed. In FIG. 14, a word line WL connected to the memory cell transistor MT serving as write target in the NAND string NS is referred to as selected word line WL, and a word line WL connected to the memory cell transistor MT not serving as write target is referred to as non-selected word line WL.

At time T1, the row decoder 28 applies voltage VREAD from the voltage VSS (for example, 0 V) to the non-selected word lines, and applies voltage BR to the selected word line WL. The sequencer 25 read the lower page by performing strobe during a period from time T1 through time T2, to determine the lower bits.

After the lower bits are determined, at time T2, the row decoder 28 continuously applies the voltage VREAD to the non-selected word lines, and applies voltage CR to the selected word line WL. The sequencer 25 read the upper page by performing strobe during a period from time T2 through time T3, to determine the upper bits.

At time T3, the row decoder 28 applies the voltage VSS to the non-selected word lines WL and the selected word line WL, to end the reading operation.

With the operation described above, three pieces of data "01", "00", and "10" are read from the memory cell transistors MT.

2.2 Effect of the Present Embodiment

According to the second embodiment, the controller circuit 10 issues commands that are different between the case of reading data written using the state "Er", and the case of reading data written without using the state "Er". This structure enables omission of the operation of applying the reading voltage AR serving as substantially unnecessary reading voltage, in the case of reading data written without using the state "Er". This structure shortens the time required for a reading operation.

3. Modifications

The first embodiment and the second embodiment described above are not limited to the examples described above, but can be variously modified.

3.1 First Modification

For example, the second embodiment described above illustrates the case of applying the reading voltages BR and CR that are the same as those in the case of reading data written using the state "Er", in the case of reading data written without using the state "Er", but the structure is not limited thereto.

Figure 15:
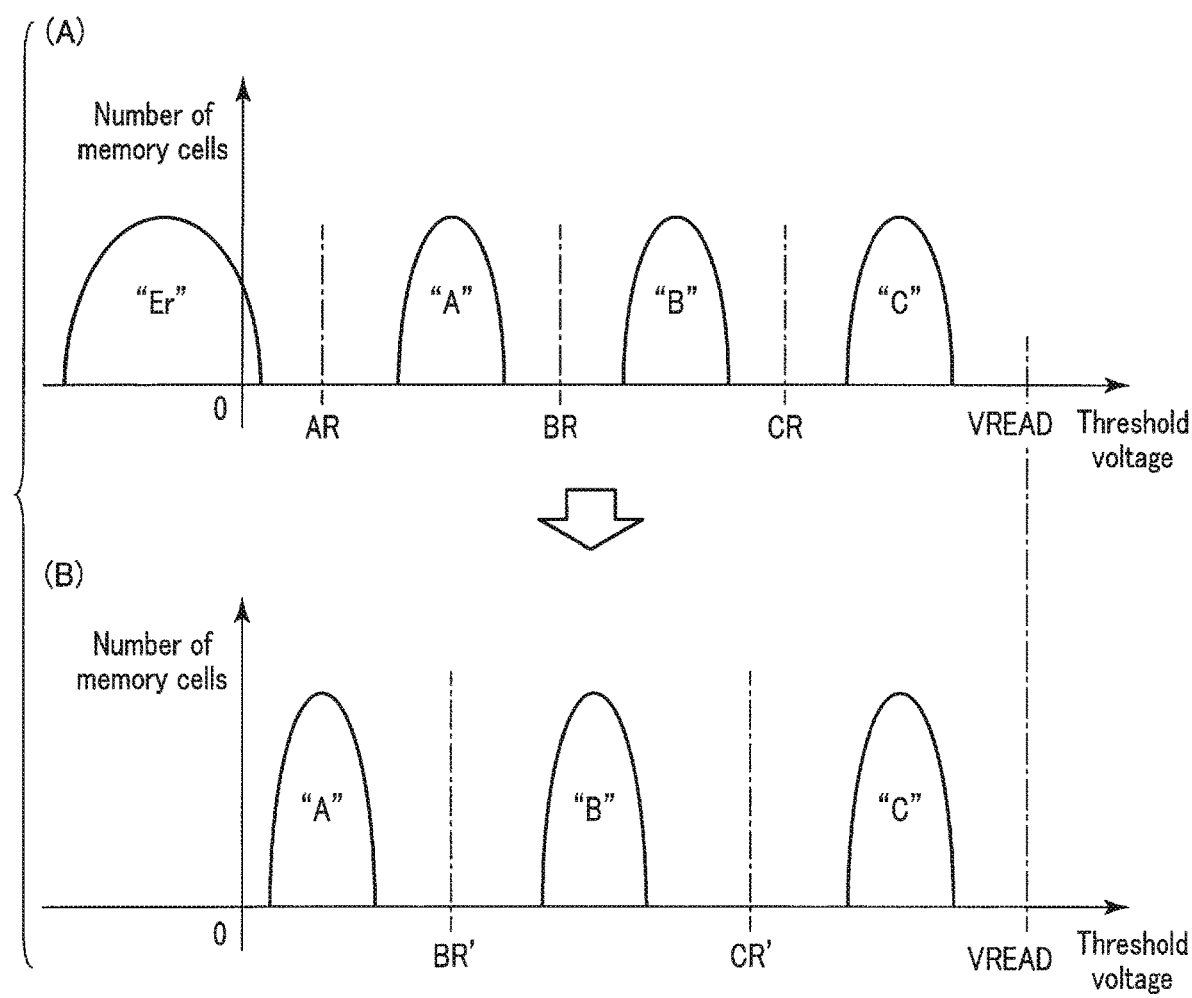
FIG. 15 is a schematic diagram for explaining a reading operation in a memory system according to a first modification.

FIG. 15 is a schematic diagram for explaining a reading operation in a memory system according to the first modification. As illustrated in FIG. 15, the reading voltages applied in the case of reading data written without using the state "Er" may be different from the reading voltages BR and CR.

In the example of FIG. 15, a reading voltage BR' is used as a voltage to distinguish the state "A" and the state "B", and a reading voltage CR' is used as a voltage to distinguish the state "B" and the state "C". More specifically, for example, a value larger than 0 V is set as the reading voltage BR'. A value larger than the reading voltage BR' and smaller than the voltage VREAD is set as the reading voltage CR'.

Setting the reading voltage BR' and CR' described above enables use of all the range of the voltage from 0 V through the voltage VREAD as a width of the threshold voltage that the three states "A" through "C" can have. This structure increases the width of the threshold voltage that can be taken in one state, in comparison with the case of using the state "Er", reduces overlapping of the threshold voltage distributions between the states, and improves the reliability of data.

3.2 Second Modification

The first embodiment and the second embodiment described above illustrate the case where each of the memory cell transistors MT is a MLC capable of storing two-bit data, but the structure is not limited thereto. For example, the first embodiment and the second embodiment described above are also applicable to the case where each of the memory cell transistors MT is a TLC (Triple Level Cell) capable of storing three-bit data, or a memory cell capable of storing four-bit data or more.

For example, in the case of causing the memory cell transistor MT to retain three-bit data without using the state "Er", the semiconductor storage unit 20 applies the reading voltages six times that is less by one than usual, to determine the three-bit data. The controller circuit 10 converts the read data into septenary data, to enable reading of data without excess or shortage.

Because the value of the voltage VREAD is determined by design of the semiconductor storage device 20, the range in which the threshold voltage of one state can be distributed is limited, as the number of bits that can be retained in one memory cell transistor MT increases. For this reason, the first embodiment and the second embodiment should be applied more to the case where the number of bits that can be retained is large, to ease the restrictions accompanying overlap of the threshold voltage distributions between the states.

3.3 Third Modification

The first and the second embodiments described above illustrate the case where one state (state "Er") is not used for an MLC that can have four states, but the structure is not limited thereto. For example, the first and the second embodiments described above are also applicable in the same manner to the case where reading and writing are performed without using two or more states including the state "Er", on a memory cell transistor MT capable of retaining bits of the larger number than that of TLC or the like.

For example, in the case of causing the memory cell transistor MT to retain three-bit data without using a plurality of state including the state "Er", the semiconductor storage device 20 applies the reading voltage four times or more and less than seven times, to determine the three-bit data. The controller circuit 10 converts the read data into quinary through septenary data, to enable reading of data without excess or shortage. Specifically, in the case of retaining n-bit data, the semiconductor storage device 20 applies the reading voltage k times ($2^{\wedge}(n-1) \le k < 2^{\wedge}n-1$), to determine the n-bit data. The controller circuit 10 also converts the read data into (k+1) decimal data, to enable reading of data without excess or shortage.

3.4 Others

In each of the embodiments and each of the modifications described above, the following matters are applicable.

In a multi-level reading operation (read), the voltage applied to the selected word line in a reading operation of level A falls within a range of, for example, 0 V through 0.55 V. The voltage is not limited thereto, but may fall within a range of one of 0.1 V through 0.24 V, 0.21 V through 0.31 V, 0.31 V through 0.4 V, 0.4 V through 0.5 V, and 0.5 V through 0.55 V.

The voltage applied to the selected word line in a reading operation of level B falls within a range of, for example, 1.5 V through 2.3 V. The voltage is not limited thereto, but may fall within a range of one of 1.75 V through 1.8 V, 1.8 V through 1.95 V, 1.95 V through 2.1 V, and 2.1 V through 2.3 V.

The voltage applied to the selected word line in a reading operation of level C falls within a range of, for example, 3.0 V through 4.0 V. The voltage is not limited thereto, but may fall within a range of one of 3.0 V through 3.2 V, 3.2 V through 3.4 V, 3.4 V through 3.5 V, 3.5 V through 3.7 V, and 3.7 V through 4.0 V.

The time (tR) of the reading operation may fall within a range of one of 25 μs through 38 μs, 38 μs through 70 μs, and 70 μs through 80 μs.

The writing operation includes a programming operation and a verifying operation. In the writing operation, the voltage applied initially to the word line selected in the programming operation falls within a range of, for example, 13.7 V through 14.3 V. The voltage is not limited thereto, but may fall within a range of one of 13.7 V through 14.0 V, and 14.0 V through 14.7 V.

The voltage initially applied to the selected word line in writing to the word line of an odd number may be set different from the voltage initially applied to the selected word line in writing to the word line of an even number.

When ISPP (Incremental Step Pulse Program) is adopted for the programming operation, an example of the step-up voltage is approximately 0.5 V.

The voltage applied to the non-selected word lines may fall within a range of, for example, 7.0 V through 7.3 V. The voltage is not limited thereto, but may fall within a range of 7.3 V through 8.4 V, or be less than 7.0 V.

The pass voltage to be applied may be changed according to whether the non-selected word line is a word line of an odd number or a word line of an even number.

The time (tProg) of the writing operation may fall within a range of, for example, one of 1700 μs through 1800 μs, 1800 μs through 1900 μs, and 1900 μs through 2000 μs.

In the erasing operation, the voltage initially applied to the well formed in the upper portion of the semiconductor substrate (silicon substrate), and above which the memory cells are arranged, falls within a range of, for example, 12 V through 13.7 V. The voltage is not limited thereto, but may fall within a range of, for example, one of 13.7 V through 14.8 V, 14.8 V through 19.0 V, 19.0 V through 19.8 V, and 19.8 V through 21 V.

The time (tErase) of the erasing operation may fall within a range of, for example, one of 3000 μs through 4000 μs, 4000 μs through 5000 μs, and 4000 μs through 9000 μs.

Each of the memory cells includes a charge cumulative layer disposed on the semiconductor substrate (silicon substrate), with a tunnel insulating film with a thickness of 4 through 10 nm interposed therebetween. The charge cumulative layer may have a stacked structure formed of an insulating film made of SiN or SiGN with a thickness of 2 through 3 nm, and polysilicon with a thickness of 3 through 8 nm. Metal such as Ru may be added to the polysilicon layer. The insulating film is formed on the charge cumulative layer. The insulating film includes a silicon oxide film having a thickness of 4 through 10 nm and interposed between a lower High-k film having a thickness of 3 through 10 nm and an upper High-k film having a thickness of 3 through 10 nm. An example of the High-k film is HfO. The thickness of the silicon oxide film may be set larger than the thickness of the High-k film. A control electrode having a thickness of 30 nm through 70 nm is formed on the insulating film, with a work function adjustment material having a thickness of 3 through 10 nm interposed therebetween. The work function adjustment material is a metal oxide film, such as TaO, or a metal nitride film, such as TaN. The control electrode may be formed of W or the like.

In addition, an air gap may be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a semiconductor storage device including m memory cells (m is an integer of 2 or more) connected to a word line in common, each of the m memory cells being capable of storing n-bit data (n is an integer of 2 or more); and
    a controller circuit,
    wherein the semiconductor storage device is configured to determine values of m pieces of n-bit read data stored in the all of m memory cells, by a first reading operation using k reading voltages different from each other (k is an integer equal to or higher than $2^{\wedge}(n-1)$ and less than $2^{\wedge}n-1$),
    the controller circuit is configured to convert the determined values of m pieces of n-bit read data into data corresponding to (k+1) decimal data of m digits, and
    the all of the m memory cells have a positive threshold voltage corresponding to a programmed state, without using a negative threshold voltage corresponding to an erased state, during the first reading operation.

2. The system of claim 1, wherein
    the controller circuit is configured to issue a first read command and a second read command, and the semiconductor storage device is configured to execute the first reading operation in accordance with receiving the first read command, and determine values of m pieces of n-bit read data, by a second reading operation using ($2^n-1$) reading voltages different from each other in accordance with receiving the second read command.

3. The system of claim 2, wherein a value of one of the reading voltages used in the first reading operation is different from any value of the reading voltages used in the second reading operation.

4. The system of claim 2, wherein a difference between two adjacent reading voltages in the reading voltages used in the first reading operation is larger than a difference between two adjacent reading voltages in the reading voltages used in the second reading operation.

5. The system of claim 1, wherein the controller circuit is configured to convert each of the m pieces of n-bit read data into (k+1) decimal data of one digit, and combine the m pieces of (k+1) decimal data of one digit.

6. The system of claim 1, wherein the controller circuit is configured to convert (k+1) decimal data of m digits corresponding to data acquired from outside of the controller circuit into m pieces of n-bit write data, and wherein the semiconductor storage device further includes m bit lines different from each other and electrically connectable to the m respective memory cells, and is configured to release the m bit lines from an inhibit state, in a writing operation of writing the m pieces of n-bit write data to the m memory cells.

7. The system of claim 6, wherein all of the m memory cells to which the m pieces of n-bit write data have been written by the writing operation have a positive threshold voltage and have no negative threshold voltage.

8. The system of claim 6, wherein the controller circuit is configured to convert each digit of the (k+1) decimal data of the m digits into one n-bit data.

9. The system of claim 1, wherein the programmed state and the erased state are not distinguished by the K reading voltages.

10. The system of claim 1, wherein the k reading voltages include no reading voltage to distinguish the programmed state and the erased state.

11. A control method of a memory system including a semiconductor storage device, the semiconductor storage device including m memory cells (m is an integer of 2 or more) connected to a word line in common, each of the m memory cells being capable of storing n-bit data (n is an integer of 2 or more), comprising:

determining values of m pieces of n-bit read data stored in the all of m memory cells in the semiconductor storage device, by a first reading operation using k reading voltages different from each other (k is an integer equal to or higher than $2^{(n-1)}$ and less than $2^n-1$), converting the determined values of m pieces of n-bit read data into data corresponding to (k+1) decimal data of m digits, wherein the all of the m memory cells have a positive threshold voltage corresponding to a programmed state, without using a negative threshold voltage corresponding to an erased state, during the first reading operation.

12. The method of claim 11, further comprising:

issuing a first read command and a second read command, executing the first reading operation in accordance with receiving the first read command, and determining values of m pieces of n-bit read data, by a second reading operation using ($2^n-1$) reading voltages different from each other in accordance with receiving the second read command.

13. The method of claim 12, wherein a value of one of the reading voltages used in the first reading operation is different from any value of the reading voltages used in the second reading operation.

14. The method of claim 12, wherein a difference between two adjacent reading voltages in the reading voltages used in the first reading operation is larger than a difference between two adjacent reading voltages in the reading voltages used in the second reading operation.

15. The method of claim 11, further comprising:

converting each of the m pieces of n-bit read data into (k+1) decimal data of one digit, and combining the m pieces of (k+1) decimal data of one digit.

16. The method of claim 11, the semiconductor storage device further including m bit lines different from each other and electrically connectable to the m respective memory cells, and the method further comprising:

converting (k+1) decimal data of m digits corresponding to data acquired from outside of the memory system into m pieces of n-bit write data, and releasing, in the semiconductor storage device, the m bit lines from an inhibit state, in a writing operation of writing the m pieces of n-bit write data to the m memory cells.

17. The method of claim 16, wherein all of the m memory cells to which the m pieces of n-bit write data have been written by the writing operation have a positive threshold voltage and have no negative threshold voltage.

18. The method of claim 16, further comprising converting each digit of the (k+1) decimal data of the m digits into one n-bit data.

19. The method of claim 11, wherein the programmed state and the erased stated are not distinguished by the K reading voltages.

20. The method of claim 11, wherein the k reading voltages include no reading voltage to distinguish the programmed state and the erased state.

* * * * *